United States Patent [19]

Kato et al.

[11] Patent Number: 5,280,231
[45] Date of Patent: Jan. 18, 1994

[54] BATTERY CONDITION DETECTING APPARATUS AND CHARGE CONTROL APPARATUS FOR AUTOMOBILE

[75] Inventors: Hidetoshi Kato, Suzuka; Nobuo Mayumi, Toyohashi; Masatoshi Togawa, Kariya; Keiichiro Banzai, Toyota; Takeshi Sada, Kariya; Hirohide Sato, Toyokawa, all of Japan

[73] Assignee: Nippondenso Co., Ltd., Kariya, Japan

[21] Appl. No.: 721,338

[22] Filed: Jul. 1, 1991

[30] Foreign Application Priority Data

Jul. 2, 1990 [JP] Japan .................. 2-175023
Oct. 12, 1990 [JP] Japan .................. 2-274847
Nov. 28, 1990 [JP] Japan .................. 2-332939
Jan. 18, 1991 [JP] Japan .................. 3-004352
Jun. 11, 1991 [JP] Japan .................. 3-139270

[51] Int. Cl.$^5$ .............................................. H02J 1/00
[52] U.S. Cl. ........................................... 320/31; 320/43
[58] Field of Search .................. 320/14, 43, 44, 31, 320/32, 39, 40, 60, 61, 64, 68

[56] References Cited

U.S. PATENT DOCUMENTS

| | | | |
|---|---|---|---|
| 4,384,321 | 5/1983 | Rippel | 320/43 X |
| 4,390,841 | 6/1983 | Martin et al. | 324/427 |
| 4,775,827 | 10/1988 | Ijntema et al. | 320/44 |
| 4,835,453 | 5/1989 | Munning Schmidt et al. | 320/13 |
| 4,852,540 | 8/1989 | Safranek | 320/40 X |
| 4,901,008 | 2/1990 | Quastel et al. | 324/117 H |
| 4,972,140 | 11/1990 | Okazaki et al. | 324/117 H |
| 5,012,176 | 4/1991 | LaForge | 320/43 X |
| 5,049,804 | 9/1991 | Hutchings | 320/31 X |
| 5,193,067 | 3/1993 | Sato et al. | 320/39 X |
| 5,218,288 | 6/1993 | Mickal et al. | 320/43 X |

FOREIGN PATENT DOCUMENTS

| | | |
|---|---|---|
| 0300537 | 7/1988 | European Pat. Off. . |
| 53-79237 | 7/1978 | Japan . |
| 53-127646 | 11/1978 | Japan . |
| 55-52779 | 12/1980 | Japan . |
| 8901169 | 2/1989 | United Kingdom . |
| 2219864 | 12/1989 | United Kingdom . |

OTHER PUBLICATIONS

"Fuel Gage" for Electric Vehicles', N.T.I.S. Tech Notes (Electrotechnology) No. 1B, Jan. 1985, pp. 71–72.

Primary Examiner—Kristine L. Peckman
Attorney, Agent, or Firm—Cushman, Darby & Cushman

[57] ABSTRACT

A battery condition detecting apparatus includes a current detecting apparatus, a voltage detector and a current accumulator of a battery. The battery condition detecting apparatus detects a first battery capacity when an engine is started based on the battery voltage and battery current when the starter is started; determines an initial capacity of the battery based on the first battery capacity; adds to this initial capacity, a battery current accumulated value which has been accumulated by the battery current accumulator after determining the first battery capacity, whereby a second battery capacity is detected after the engine has been started; and further comparing the presently detected first battery capacity with the second battery capacity just before this first battery capacity is detected, thereby setting the smaller capacity as the initial value. Then, a charge control apparatus for a vehicle sets a battery charging target value, depending on the initial capacity which has been set by the initial capacity setting apparatus of this battery condition detecting apparatus, and controls the alternator in such a manner that the battery is charged at this target value.

39 Claims, 16 Drawing Sheets

F I G. 16
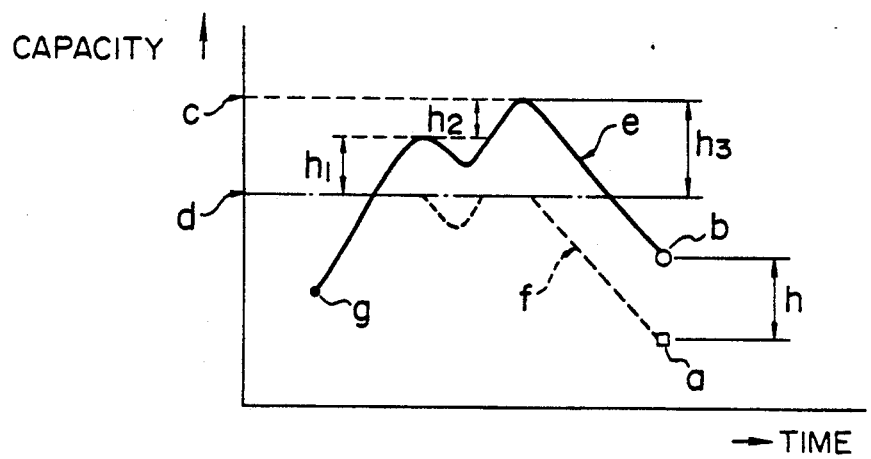
F I G. 17
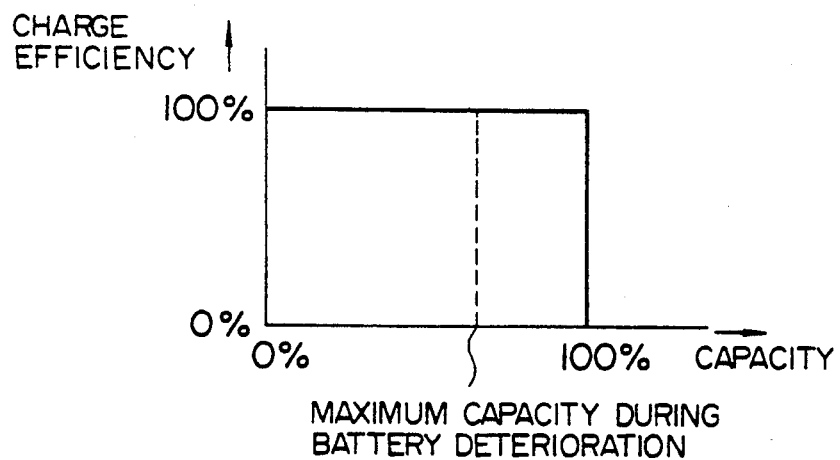
F I G. 18
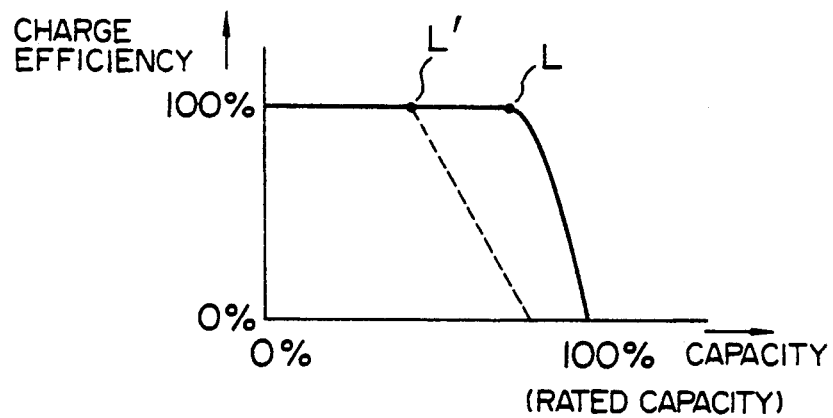

BATTERY CONDITION DETECTING APPARATUS AND CHARGE CONTROL APPARATUS FOR AUTOMOBILE

BACKGROUND OF THE INVENTION

The present invention relates to a battery condition detecting apparatus to correctly grasp conditions of a battery, i.e., capacities thereof, and also a charge control apparatus for an automobile, for setting a charge target value of a battery based on conditions of the battery mounted on the automobile with employment of the battery condition detecting apparatus, and for charging the battery at this target value during the drive operation.

As shown in JP-A-53-127646, as a conventional means for detecting capacities of a battery mounted on a vehicle, with the capacity of the battery obtained from the discharge characteristic while the starter is started, the charge/discharge currents of the battery after this capacity are accumulated, or multiplied.

Thus, when the battery capacity detecting means detects that the capacity of the battery is lowered, it is possible to prevent the battery from being lowered by cutting out a predetermined electric load from the battery. Also, there has been proposed such a method for controlling power generated by the alternator, taking account of the capacities of the battery and the conditions of the vehicle.

In general, a battery has a charge characteristic as represented in FIG. 5. That is to say, as indicated by a solid line of this figure, an increase ratio of a capacity to a charge current (referred to as a "charge efficiency") is substantially 100% under such a condition that the capacity of the battery is lower than about 80% of the actual capacity when this battery is a new product. However, if the capacity of the battery becomes higher than about 80% of the actual capacity by being charged, since gassing (such a phenomenon that while the battery is charged and the capacity thereof is increased, the voltage of the electrode is increased; and when this electrode voltage is increased higher than a predetermined value, water contained in the battery fluid is subjected to electrodialysis due to the charge current) may happen to occur, the charge efficiency is gradually lowered. Then, while the battery is deteriorated, a timing at which the gassing phenomenon commences is gradually shortened, namely a timing at which the charge efficiency starts to be lowered is gradually shortened, and also the charge efficiency is rapidly lowered. The capacity at which the battery can be charged (referred to as "a maximum capacity") is reduced and then the capacity cannot be increased to the actual capacity (=maximum capacity of a new battery). In other words, there are differences in the charge characteristics of a new battery and a deteriorated battery. A dot line shown in FIG. 5 indicates one example of the charge characteristic for the deteriorated battery.

Furthermore, a capacity of a battery is also reduced due to a discharge operation. As a consequence, according to the conventional battery condition detecting method, even when lowering the battery capacity may be detected, no detection is made that this detection is caused by either the discharge operation, or the battery deterioration.

Then, to control power generated by the alternator taking account of the conditions of the vehicle, it is absolutely necessary to charge the battery. In case when the battery is deteriorated, most of the charge currents are used for the gassing, so that the battery fluid is reduced, which may cause adverse influences to the lifetime of the battery. There is another problem that although the capacity of the battery is not increased under such a condition that the maximum capacity is lowered and the charge current is continuously supplied to the battery, if the charge operation is continued, lowering the battery fluid caused by the gassing is further increased.

SUMMARY OF THE INVENTION

A primary object of the present invention is to provide a battery condition detecting apparatus capable of recognizing that a battery is deteriorated due to variations of charge characteristics thereof. Then, a secondary object of the present invention is to provide a charge control apparatus for an automobile, capable of charging a battery while extremely suppressing an amount of gassing by employing this battery condition detecting apparatus.

To achieve the primary object, it is provided such a battery condition detecting apparatus comprising:
  battery current detecting means for detecting charge/discharge currents of a battery;
  battery voltage detecting means for detecting a terminal voltage of the battery;
  battery current accumulating means for accumulating the charge/discharge currents of said battery which has been detected by said battery current detecting means;
  first battery capacity detecting means for detecting a first battery capacity based on the voltage of the battery which is detected by said battery voltage detecting means when the charge current of said battery detected by said battery current detecting means is a predetermined value;
  initial capacity setting means for setting an initial capacity of the battery based upon the first battery capacity detected by said first battery capacity detecting means; and also,
  second battery capacity detecting means for adding a battery current accumulated value obtained after the detection of the said first battery capacity which has been accumulated by said battery current accumulating means to said initial capacity set by said initial capacity setting means so as to be detected as a second battery capacity,
  said initial capacity setting means comparing a first battery capacity detected at present time with a second battery capacity obtained just before the detection of this first battery capacity, and a smaller battery capacity being set as the initial capacity of the battery.

To achieve the above-described secondary object, it is provided the change control apparatus for the vehicle comprising:
  a starter driven by a battery mounted on a vehicle, for starting an engine;
  an alternator for the vehicle, driven by said engine, for charging said battery;
  battery current detecting means for detecting charge/discharge currents of said battery;
  battery voltage detecting means for detecting a terminal voltage of the battery;
  battery current accumulating means for accumulating the charge/discharge currents of said battery which has been detected by said battery current detecting means;

first battery capacity detecting means for detecting a first battery capacity based on the voltage of the battery when the engine is started which is detected by said battery voltage detecting means when the charge current of said battery detected by said battery current detecting means is a predetermined value during commencement of said starter;

initial capacity setting means for setting an initial capacity of the battery based upon the first battery capacity detected by said first battery capacity detecting means; and, also, second battery capacity detecting means for adding a battery current accumulated value obtained after the detection of the said first battery capacity which has been accumulated by said battery current accumulating means to said initial capacity set by said initial capacity setting means so as to be detected as a second battery capacity after the engine is started;

wherein said initial capacity setting means comparing a first battery capacity detected at present time with a second battery capacity obtained just before the detection of this first battery capacity, and a smaller battery capacity being set as the initial capacity of the battery; the charge control apparatus further comprising;

target value setting means for setting a charge target value of the battery after the engine has started in response to the initial capacity set by the initial capacity setting means of said battery condition detecting apparatus; and, generation controlling means for controlling power generated by the alternator for the vehicle in such a manner that said battery is charged at the target value set by said target value setting means.

In accordance with the above-described battery condition detecting apparatus, the first battery capacity which has been detected based upon the discharge characteristic when the battery discharges at a predetermined current, is compared with the second battery capacity which has been detected based on the accumulated value of the battery charge/discharge currents, and then the smaller capacity is set to the initial capacity. As a result of this comparison, if the second battery capacity is higher than the first battery capacity, it may be detected that the second battery capacity becomes higher than the actual capacity due to an occurrence of gassing. As previously stated, the occurrence of gassing is caused by the variations in the charge efficiency due to the battery deterioration. In case that such a comparison result is obtained that the second battery capacity is greater than the first battery capacity, since the difference between the first and second battery capacities are also changed in accordance with the variations in the charge efficiency, it is possible to judge based on this difference a degree of battery deterioration.

Also, in accordance with the charge control apparatus employing the above-explained battery condition detecting apparatus, since based on the gassing amount obtained by comparing the first battery capacity with the second battery capacity, the charge target value of the battery is set, the battery is charged while extremely suppressing the occurrence of gassing. As a consequence, since the over-charge of the battery may be prevented, it is possible to prevent shortening the lifetime of the battery. Also, such a control is performed that the difference between the first and second battery capacities becomes small during the comparison, and the first and second battery capacities obtained by the different detecting means have the substantially equal values with each other. In other words, these first and second battery capacities detect the correct battery capacity. As a result, more correct battery capacity can be recognized.

BRIEF DESCRIPTION OF THE DRAWINGS

These and other objects and advantages of the present invention will become apparent by reference to the following description and accompanying drawings, wherein;

FIG. 16 is a characteristic diagram for representing a transition of a battery capacity;

FIG. 17 is a characteristic diagram for analogously representing a characteristic of a charging efficiency with respect to a battery capacity when a battery is charged;

FIG. 18 is a characteristic diagram for representing a charging efficiency with respect to a battery capacity when a battery is charged;

FIGS. 19 to 21 are explanatory diagrams for showing an arrangement of a current detecting apparatus according to a preferred embodiment of the present invention, in which FIG. 19 is a circuit diagram of the current detecting apparatus; FIGS. 20 and 21 are characteristic diagrams of the current detecting apparatus; and, FIG. 22 represents an overall construction of an automobile charging control apparatus employing the current detecting apparatus shown in FIG. 19.

DESCRIPTION OF THE PREFERRED EMBODIMENTS

First Preferred Embodiment

A description will now be made of an automobile charge control apparatus into which a battery condition detecting apparatus according to a first preferred embodiment of the present invention.

Figure 1:
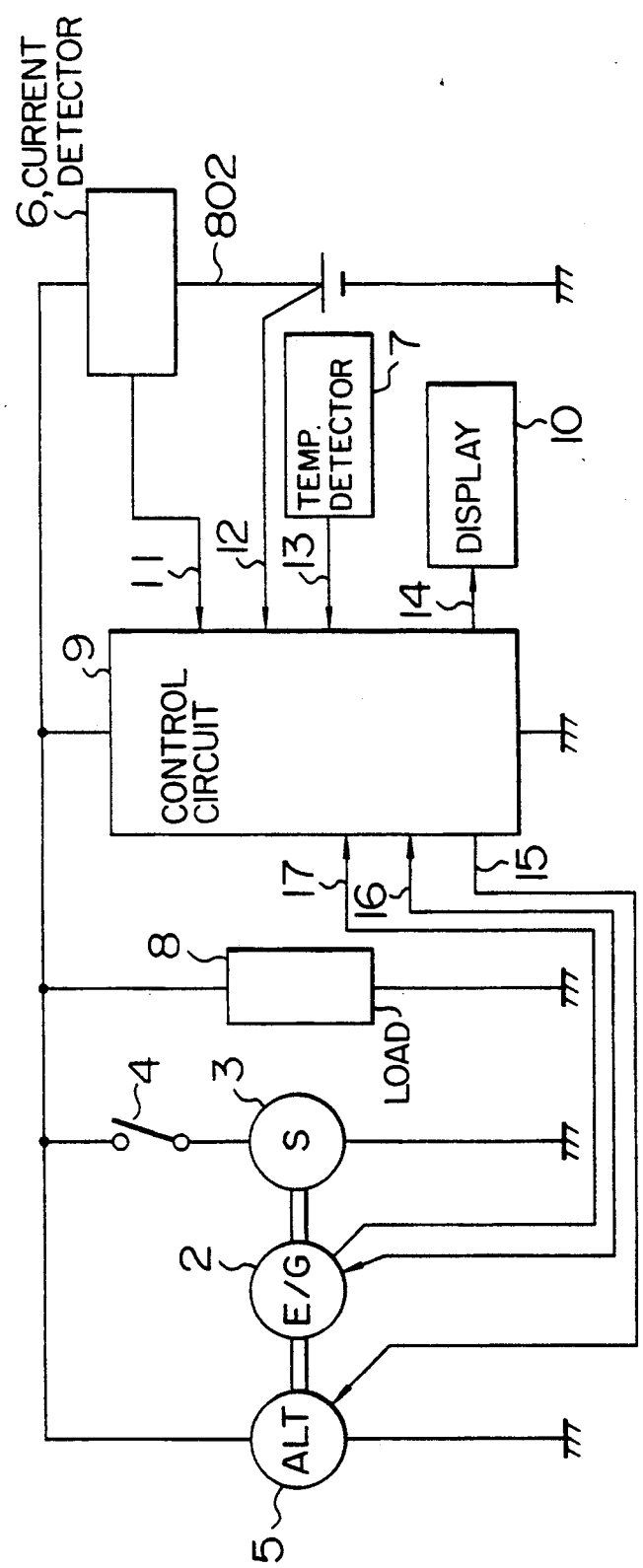
FIG. 1 is a diagram for representing an overall arrangement of an automobile charge control apparatus employing a battery condition detecting apparatus according to first and second preferred embodiments of the present invention.

In FIG. 1, reference nuemral 1 indicates a battery mounted on an automobile; reference numeral 2 denotes an engine for driving the automobile, reference numeral 3 represents a starter for starting the engine; reference numeral 4 indicates a starter switch for commencing the start. As is well known, by turning on the starter switch 4 so as to supply power from the battery 1 to the starter 3, this starter 3 is rotated and the engine 2 starts.

Reference numeral 5 indicates an alternator driven by the engine 2 via a belt and a pulley (both are not shown), for charging the battery 1 and also supplying the power to an electric load 8 such as a lamp, a blower motor and defogger. Reference numeral 6 indicates a current detector for detecting charge/discharge current of the battery 1; reference numeral 7 denotes a temperature detector for detecting temperature of the battery 1; reference numeral 9 indicates a control circuit employing a microcomputer, for detecting conditions of the engine 2, and voltages, currents and temperature of the battery 1 in order to control revolution number of the engine 2 and AC power of the alternator 5, and furthermore for detecting life of the battery 1 so as to display the life by way of a display device 10. As to controls effeced in the control circuit 9, (I) detection of a battery capacity; (II) setting of a charge target value for the battery; and (III) charge control of the battery during drive conditions will now be described in this order.

(I). Detection of Battery Capacity

Figure 2:
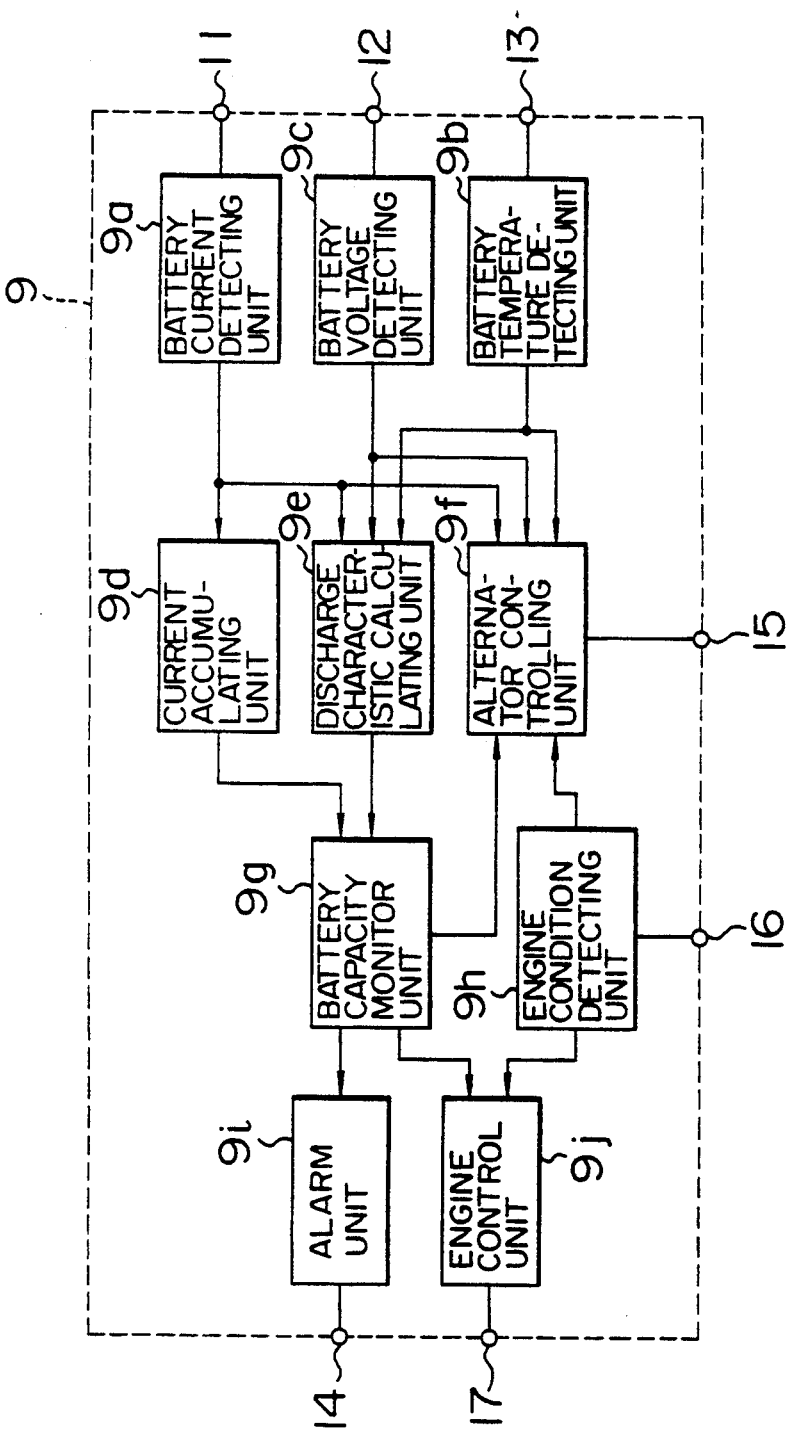
FIG. 2 is a schematic block diagram for representing a process function of the control circuit shown in FIG. 1.
Figure 3:
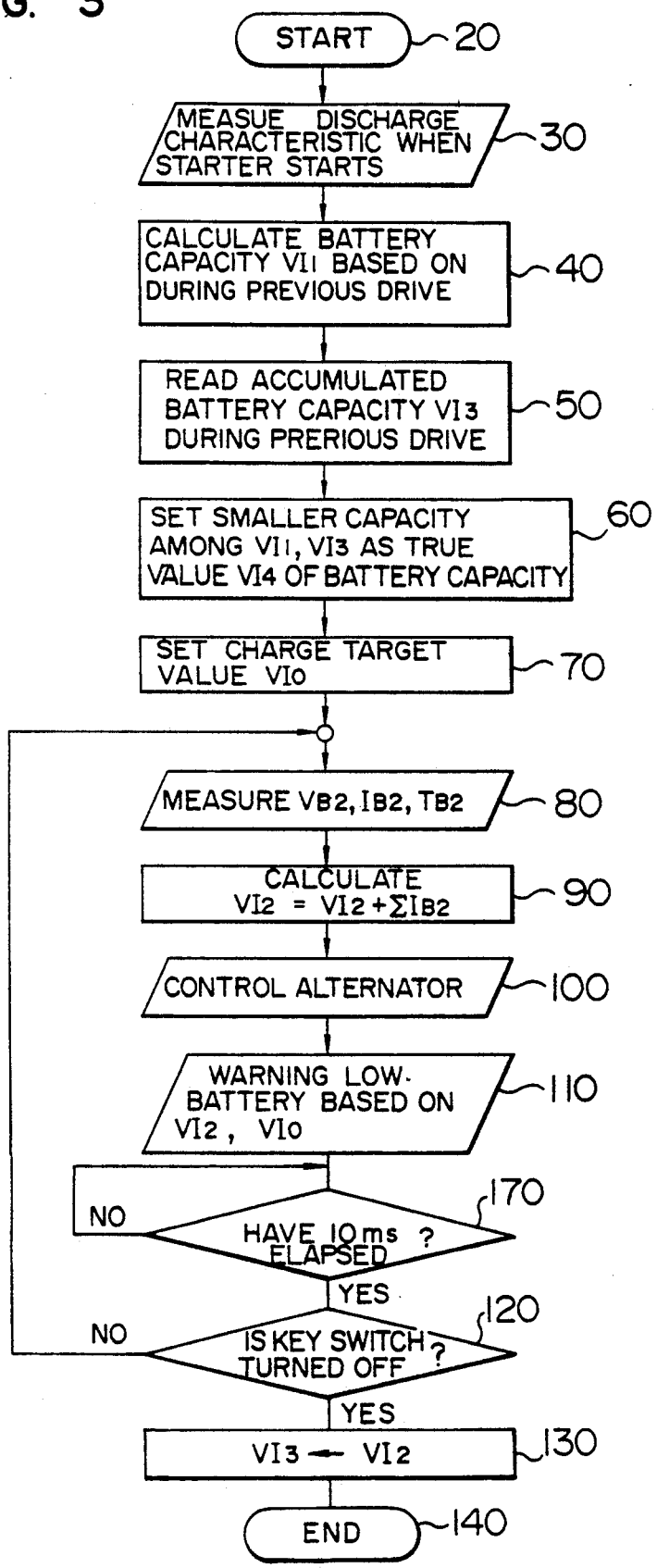
FIG. 3 is a flow chart for representing the process performed in the control circuit according to the first preferred embodiment.
Figure 6:
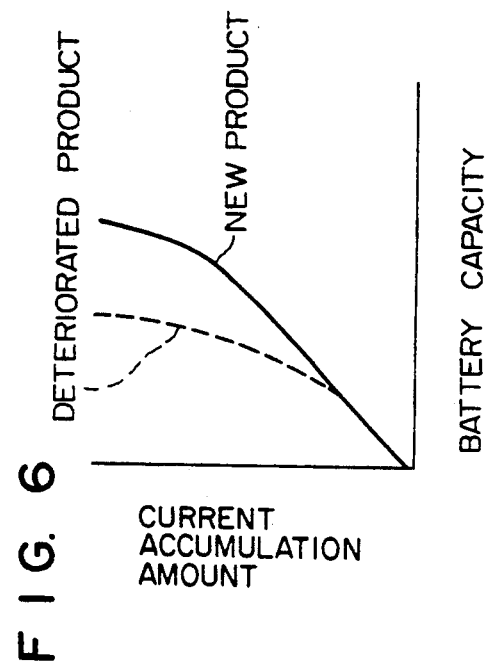
FIG. 6 is a characteristic diagram for indicating an accumulation amount of a battery charge current with respect to a battery capacity when a battery is charged.

FIG. 2 is a schematic block diagram for representing process functions performed in the control circuit 9, and FIG. 3 is a flow chart for representing the controls effected in this control circuit 9. A description of the battery capacity detection will now be made based on these figures.

Figure 8:
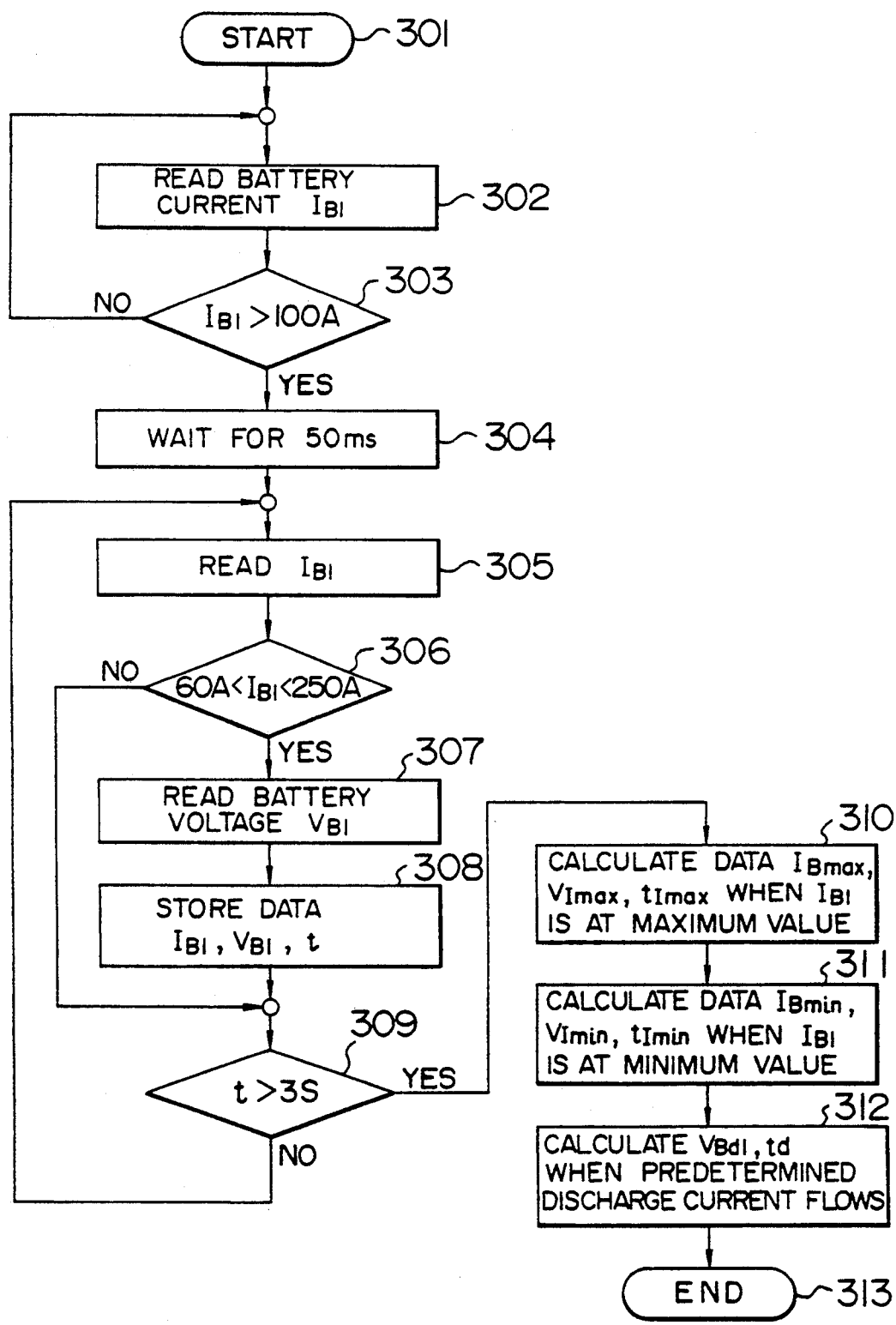
FIG. 8 is a flow chart for representing a detailed process of the step 30 shown in FIG. 3, more in detail.

In the flowchart shown in FIG. 3, the starter switch 4 is turned on at a step 20 whereby the starter 3 starts. Next, the discharge characteristic when the starter starts is measured at a step 30. This operation will now be explained in accordance with a flow chart to FIG. 8.

At a step 302, a discharge current "$I_{B1}$" of the battery 1 which has been detected by the current detector 6 is read from the current detecting unit 9a. At a step 303, when the discharge current $I_{B1}$ becomes higher than 100 (A), confirmation is made that the starter 3 starts. As a step 304, a waiting process is performed for, e.g., 50 ms after the confirmation is made that the starter 3 starts at the above-described step 303. This waiting process is required, since a large current rapidly flows just after the starter 3 starts and then noise may happen to occur, whereby no adverse influence caused by the noise is made. After the adverse influence caused by the noise has been eliminated at the step 304, the discharge current "$I_{B1}$" of the battery 1 is read from the current detecting unit 9a at a step 305.

Then, at a step 306 if the discharge current $I_{B1}$ which has been read at the step 305 is present within a range from 60A to 250A, a judgement is made that the starter 3 is under operation. When it is judged that the starter 3 is under operation at the step 306, a voltage "$V_{B1}$" of the battery 1 is read from the voltage detecting unit 9c at a step 307. It should be noted that since the above-described range of the discharge current has been set under such a judgement that when the starter 3 is under operation and the engine 2 is not yet started, the current having 60A to 250A flows through the starter 3, this range is not limited thereto.

Subsequently, at a step 308, the above-described discharge current $I_{B1}$, voltage $V_{B1}$ and time "t" of the battery 1 are stored into the discharge characteristic calculating unit 9e functioning as a first means for detecting a battery capacity. At a step 309, when three seconds has elapsed after the starter 3 starts (normally, this time has been set to a large value, taking account of such a fact that only one second will pass from starting the starter 3 until the engine starts), the operations as defined from the above-described steps 305 to 308 are interrupted. If three seconds have not yet elapsed after the starter 3 starts, the process is again returned to a step 305. At this time, the operations as defined from the steps 305 to 309 are performed, namely the dischrge current $I_{B1}$ and voltage $V_{B1}$ when the starter 3 is under operation are needed and the storage operation is repeated at a interval of 25 ms, and the discharge current $I_{B1}$ and voltage $V_{B1}$ corresponding to the time "t" at this time are stored. It should be noted that the discharge characteristic calculating unit 9e continuously stores 10 pieces of new data.

Then, at a step 306, when it is judged that the discharge current becomes lower than 60A and the engine 2 starts, the operations as defined by the steps except for the steps 307 and 308 are repeated, and after three seconds have elapsed when the starter starts, the process at the step 309 is advanced to a step 310. At the step 310, a maximum value $I_{Bmax}$ of the discharge current $I_{B1}$ of the battery 1, the voltage $V_{B1}$ and time "t" which are read at the same time with this maximum value $I_{Bmax}$ are calculated as $V_{1max}$ and $t_{tmax}$ based on the data stored at the step 308. At the next step 311, conversely, a minimum value $I_{Bmin}$ of the discharge current $I_{B1}$, and the voltage $V_{B1}$ and time "t" which are read not the same time with this minimum value $I_{Bmin}$ are calculated as $V_{tmin}$ and $t_{tmin}$, respectively. At a step 312, to a graphic representation is created. The abscissa of the graph indicates the discharge current $I_{B1}$ and the ordinate represents the voltage $V_{B1}$. The maximum value $I_{Bmax}$ of the discharge current which have been calculated at the steps 310 and 311, and the voltage $V_{Imax}$ at this time are plotted as a coordinate point on the graph. The minimum value $I_{Bmin}$ of the discharge current and the voltage $V_{Imin}$ at this time are also plotted as a coordinate point on the graph. A characteristic diagram where these values are connected by a straight line is then drawn. Next, based upon this characteristic diagram, the voltage $V_{B1}$ when the discharge current $I_{B1}$ is equal to 150A is calculated as a capacity detection voltage $V_{Bd1}$. The time "t" defined from the commencement of the starter until the detection of the above-described voltage $V_{Bd1}$ is recognized as a capacity detection time "td" by averaging the times $t_{Imax}$ and $t_{Imin}$ calculated at the steps 310 and 311. It should be noted that the value of the discharge current $I_{B1}$ for determining the first capacity detection voltage $V_{Bd1}$ is not limited to 150A.

Figure 9:
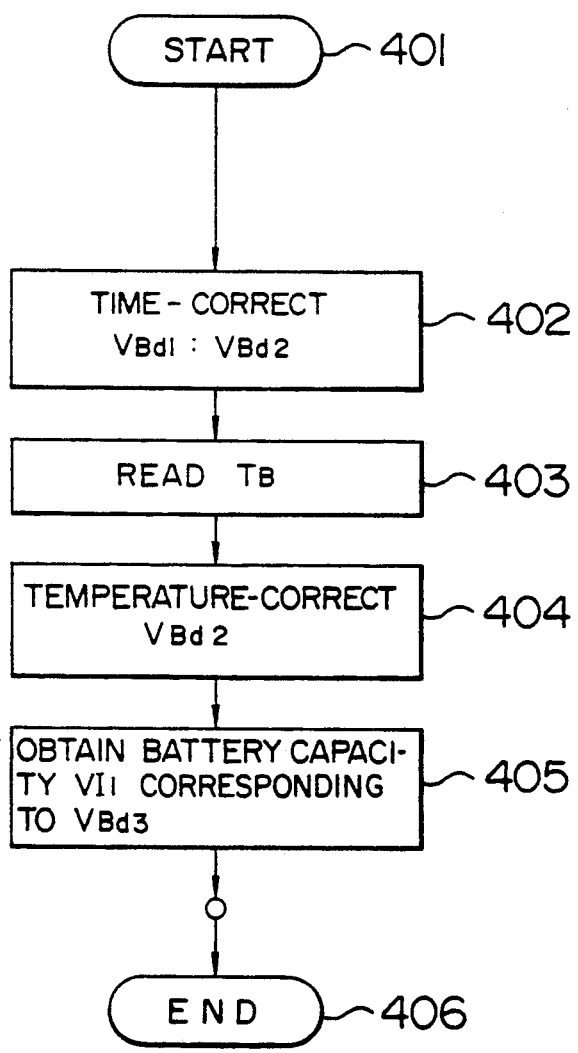
FIG. 9 is a flow chart for showing a detailed process of the step 40 shown in FIG. 8, more in detail.

The detected first capacity detection voltage $V_{Bd1}$ is corrected due to the following reasons as shown in FIG. 9. The voltage of the battery 1 when discharging is lowered in accordance with a lapse of time, and becomes a stable voltage value after approximately five seconds have passed from the commencement of the battery discharge. To the contrary, as stated above, the engine 2 is normally started by driving the starter 3 within one second. The measurement value of the battery voltage when the starter 3 starts, namely the first capacity detection voltage $V_{Bd1}$ measured in the above-described manner indicates such a voltage higher than the stable voltage. Then, a relationship between the discharge time and voltage of the battery characteristics is previously obtained, and at a step 402, a shift "AV" between the first capacity detection voltage $V_{Bd1}$ determined by the discharge current while driving the starter 3 and the stable voltage which is obtained after five seconds have passed when the starter 3 starts, is subtracted from the first capacity detection voltage $V_{Bd1}$ for correction purpose. With such a correction, a more correct voltage of the battery 1 when the battery 1 discharges at 150A may be obtained, which will be referred to as a "second capacity detection voltage $V_{Bd2}$".

Furthermore, since the battery voltage has a temperature characteristic, a battery temperature $T_B$ detected by the battery temperature detector 7 is inputted into the battery temperature detecting unit 9b at a step 403. Thus the second capacity detection voltage $V_{Bd2}$ is corrected in accordance with the battery temperature $T_B$ at a step 404. With this correction, a more correct voltage of the battery 1 may be obtained which will be referred to as a third capacity detection voltage "$V_{Bd3}$".

Figure 4:
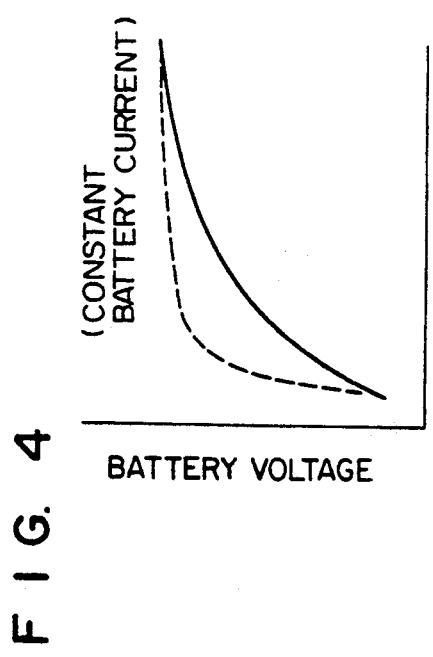
FIG. 4 is a characteristic diagram for showing a characteristic of a battery voltage with respect to a battery capacity when a battery is discharged.
Figure 5:
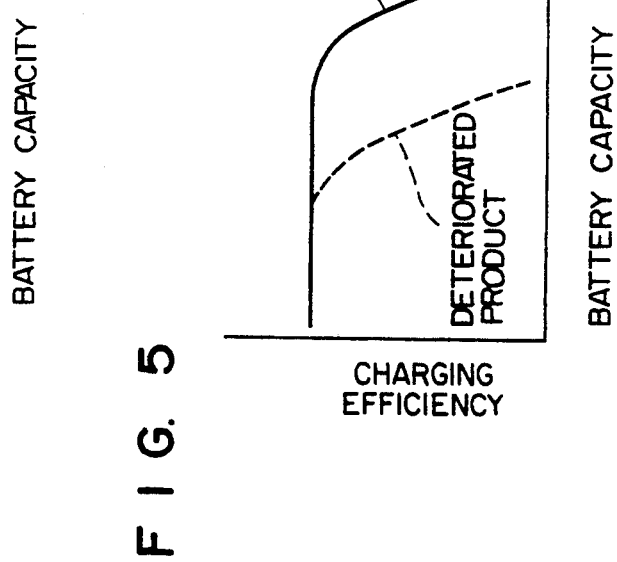
FIG. 5 is a characteristic diagram for showing a characteristic of a charging efficiency with respect to a battery capacity when a battery is charged.

Next, at a step 405, a first battery capacity $VI_1$ when the starter 3 is driven is obtained from the third capacity detection voltage $V_{Bd3}$, which will now be explained. In FIG. 4, a solid line indicates a characteristic diagram for representing a relationship between battery voltages and battery capacities under such a condition that the battery 1 discharges at a predetermined current for a predetermined time period, and also there are no electrolyte stratification of the specific gravity of the battery fluid and polarization just after the battery is charged. As represented in this drawing, in case of a small battery capacity, the battery voltage becomes low. Then, this characteristic has been stored in the discharge characteristic calculation unit 9e.

Based upon this characteristic diagram, a decision is made of a capacity of the battery 1 when the starter 3 is driven (will be referred to as a "first battery capacity") with employment of the third capacity detection voltage $V_{Bd3}$ which has been obtained as in the above-described manner.

It should be noted that if a capacity of the battery 1 is unknown due to such a fact that the previous drive corresponds to a first drive, or the battery 1 has been replaced by a new product before the previous drive although this drive does not correspond to the first drive, the battery capacity monitor unit 9g functioning as an initial capacity setting means will set the above-described first battery capacity $VI_1$ as an initial capacity. The current accumulating unit 9d accumulates the charge/discharge currents of the battery 1 after the engine 2 starts, which have been detected by the current detector 6 and read into the battery current detecting unit 9a. The battery capacity monitor unit 9g functioning also as a second battery detecting means detects a second battery capacity $VI_2$ during the drive by adding the accumulated value of the above-described charge/discharge currents to the initial capacity. Then, the battery memory 9g stores therein the last value of the second battery capacity $VI_2$, namely the capacity value obtained when the engine is stopped as a third battery capacity $VI_3$.

Assuming now that the third battery capacity $VI_3$ has been stored in the battery capacity monitor unit 9g during the present drive, namely when the engine is started at this time to drive the automobile, a description will be made as follows.

At a step 50 of the flowchart shown in FIG. 3, this third battery capacity $VI_3$ is read out. At a step 60, the above-described first battery capacity $VI_1$ detected when the starter 3 is driven is compared with the third battery capacity $VI_3$ (namely, the second battery capacity just before the first battery capacity $VI_1$ is detected) by the battery capacity monitor unit 9g, whereby a smaller value is regarded as true value and set as the initial capacity $VI_4$. Normally, if the battery condition is good, the above-described first battery capacity $VI_1$ is substantially equal to the third battery capacity $VI_3$ As a consequence, either the first or third battery capacity $VI_1$ or $VI_3$ may be employed. However, since there are the following cases, the smaller battery capacity among these first and third battery capacities $VI_1$ and $VI_3$ is employed.

In the first case, the first battery capacity $VI_1$ is larger than the third battery capacity $VI_3$ by a predetermined value. If such a phenomenon that concentration of the battery liquid near the electrode becomes high just after the specific gravity of the battery liquid undergoes electrolyte stratification or the battery is charged (which will be referred to as a "polarization") the voltage characteristic with respect to the capacity becomes as indicated by a dot line shown in FIG. 4. In other words, when either electrolyte stratification, or polarization happens to occur, the resultant battery voltage becomes higher than the normal battery voltage. As a result, if either electrolyte stratification, or polarization happens to occur when the first battery capacity is detected, the above-described capacity detection voltage higher than that during the normal condition is detected, and the first battery capacity $VI_1$ becomes larger than the true capacity and the third battery capacity $VI_3$. As a consequence, a judgement is made that the third battery capacity $VI_3$ is analogous to the true capacity, which will be set as the initial capacity.

Secondly, it is another case that the third battery capacity $VI_3$ is higher than the first battery capacity $VI_1$ by a predetermined value. This corresponds to such a case that "gassing" happens to occur, as previously described. When the gassing happens to occur, the accumulated value of the battery charge/discharge currents corresponds to a value obtained by accumulating the charge currents used in the gassing, based on the detection of the second battery capacity $VI_2$, and the second battery capacity $VI_2$ higher than the true capacity is detected. Therefore, the third battery capacity $VI_3$ corresponding to the final value in the higher second battery capacity $VI_2$ becomes higher than the true capacity and the first battery capacity $VI_1$. Furthermore, when the battery becomes deteriorated, since the charging efficiency is quickly lowered, the third battery capacity $VI_3$ becomes greater than that of the new product. As a result, in this case, it is judged that the first battery capacity $VI_1$ is analogous to the true capacity, which will be set as the initial capacity.

It should be understood that with regard to the above-described electrolyte stratification, since bubbles may be produced from the electrode in the gassing and the battery fluid is mixed with each other by the bubbles, it is rather difficult that both the electrolyte stratification and the gassing simultaneously occur. Thus, since the first and third battery capacities $VI_1$ and $VI_3$ do not commonly become large, as previously described, the correct battery capacity may be obtained by employing the smaller value.

(II). Setting Target Charging Value of Battery

Next, at a step 70 shown in FIG. 3, a target charging value (will be referred to as "an upper limit capacity") $VI_0$ of the battery 1 is determined during drive based upon the initial capacity.

For instance, when the first battery capacity $VI_1$ is greater than the third battery capacity $VI_3$, as previously described, the third battery capacity $VI_3$ is set as the initial capacity and the upper limit value $VI_0$ will be set as given by equation (1):

$$VI_0 = VI_3 + A \qquad (1)$$

Figure 7:
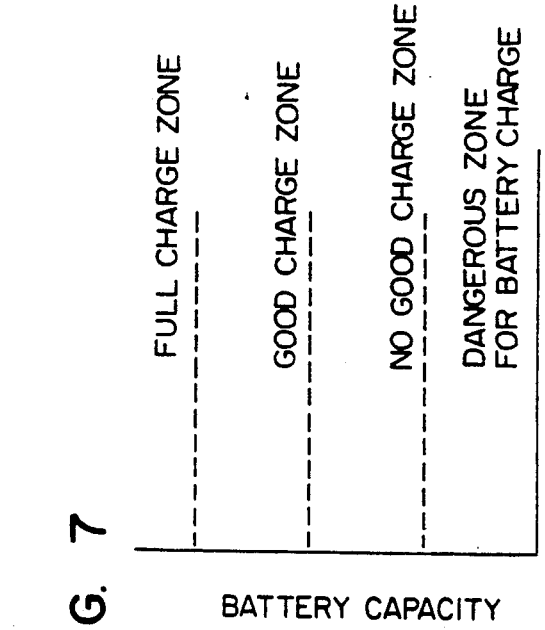
FIG. 7 is a battery condition representing diagram for representing the battery conditions as four states, depending upon its capacity.

Here, the real capacity of the battery 1 which has been employed in the present invention is 27 Ah, and as represented in FIG. 7, the conditions of the battery 1 are subdivided into four zone such as a dangerous condition where its capacity is below 9 Ah; a no good condition where its capacity is greater than 9 Ah and smaller than 18 Ah; a good condition where its capacity is greater than 18 Ah and below 25 Ah; and also a full charge condition where its capacity is higher than 25 Ah. Then, an increase value "A" for the battery capacity is set, as represented in a table 1, depending upon such a condition to which zone, the initial capacity $VI_4$ belongs.

TABLE 1

| charge condition | full charge | good | no good | dangerous |
|---|---|---|---|---|
| A [Ah] | 2 | 5 | 10 | 15 |

As indicated in the above table 1, the reason why the capacity increase value "A" has been set is as follows: When the battery 1 is under the dangerous condition, as previously described, the battery is charged as much as possible in order to control the alternator, taking account of the conditions of the automobile, whereby the battery capacity should be increased (this is similar to such a case that the battery 1 is under other three conditions). However, since the battery 1 might be deteriorated and thus the capacity thereof might be lowered, the gassing amount should also be considered. Thus, to maintain at least 50% of the real capacity, namely 13.5 Ah, for instance, the battery capacity is set to 15 Ah. When the battery 1 is under the no good condition, the charge operation should be performed as in the dangerous condition. For instance, also in such a case that the initial capacity corresponds to the minimum capacity of 9 Ah indicative of the no good condition, the battery condition is set to 10 Ah in order that the battery may be recovered until the good condition. When the battery 1 is under either the good condition, or the full charge condition, the battery capacity is set to 5 Ah or 2 Ah so as to control the above described alternator.

Then, if the third battery capacity $VI_3$ is higher than the first battery capacity $VI_1$, the first battery capacity $VI_1$ is set as the initial capacity. In this case, as previously started, it may be conceived that the gassing occurs. The upper limit value $VI_0$ is corrected based upon a correction value "B" by the following equations (2) to (4) in response to the gassing amount thereof:

$$VI_0 = VI_1 + A - B \qquad (2)$$

$$B = \alpha(VI_3 - VI_1) \qquad (3)$$

$$\alpha = 0.8 \qquad (4).$$

The correction value "B" is set so as to reduce the increase value of the battery capacity by 80% of this gassing amount in total based upon a difference between the third battery capacity $VI_3$ and the first battery capacity $VI_1$, namely the gassing amount during the previous driving operation. Therefore, the battery 1 is charged in such a manner that the capacity thereof is increased from the capacity when the starter 3 is started until the upper limit value $VI_0$. The upper limit value $VI_0$ is increased every time the automobile is driven. If the battery 1 employed in this automobile becomes deteriorated, a predetermined amount of gassing may be produced, and the increased value in the upper limit value $VI_0$ is reduced. When the increased amount of the upper limit value $VI_0$ is reduced, since the gassing amount is also lowered, the upper limit value $VI_0$ is again increased. Then the battery 1 is charged by repeating these operations and the driving operation, while suppressing the gassing.

It should be noted that to reduce the increased value of the above-described upper limit value $VI_0$ as much as possible and to furthermore suppress the gassing amount, for instance, a means for storing therein a value of the correction value "B" is employed, when such a condition that the third battery capacity $VI_3$ becomes higher than the first battery capacity $VI_1$ is continued, the previous correction value $B_0$ is compared with the present correction value $B_1$, so that the larger value among them may be employed as the present correction value "B".

(III). Control for Battery Charging Operation During Drive

At a step 80, the charge/discharge current $I_{B2}$, voltage $V_{B2}$ and temperature $T_{B2}$ of the battery 1 during the drive operation of the automobile are read; at a step 90, the charge/discharge current $I_{B2}$ is accumulated by the current accumulating unit $9d$ based upon the read data so as to obtain the battery capacity at the present driving operation in addition to the initial capacity obtained at the step 60, namely the above-described second battery capacity $VI_2$ is obtained. Then, the resultant battery capacity is stored in the battery capacity monitor unit $9g$. In other words, the second battery capacity $VI_2$ which varies moment by moment is continuously detected. Then, at a step 100, based upon information about the charge/discharge current $I_{B2}$ of the battery 1, the voltage $V_{B2}$; the temperature $T_{B2}$, the second battery capacity $VI_2$ and the upper limit capacity $VI_0$, and also the information on the engine $a$, the control for the alternator 5 is performed. Now, this control will be explained in the order of ① normal drive operation, ② idle operation, ③ acceleration operation, and ④ deceleration operation, based upon the following tables 2 through 4.

TABLE 2

| automobile control | Control charge current $I_{BC}$ [A] Charge condition | | | |
|---|---|---|---|---|
| | full charge | good | no good | dangerous |
| normal drive | 0 | 5 | | 30 |
| idle operation | | | 30 | |
| rapid load reduction acceleration | 0 | | | 30 |
| deceleration | | | 30 | |
| load control | | 0 | | 30 |

TABLE 3

| battery temperature | Control voltage $V_{BC}$ [V] charge condition | | | |
|---|---|---|---|---|
| | full charge | good | no good | dangerous |
| 40–90° C. | 12.8 | 13.5 | 14.0 | 14.5 |
| 20–40° C. | 12.8 | 14.0 | 14.5 | 15.0 |
| −30–20° C. | 12.8 | 14.5 | 15.0 | 15.5 |

TABLE 4

| automobile mode | Control voltage $V_{BC}$ [V] charge condition | | | |
|---|---|---|---|---|
| | full charge | good | no good | dangerous |
| idle operation | | +0.5 | | present |
| rapid load reduction acceleration | | −2.0 | | present |
| deceleration | +2.2 | +1.0 | +0.5 | present |
| load control | 12.8 | | | present |

It should be noted that the table 2 is a table representative of a control charge current $I_{BC}$ supplied to the battery 1 in response to the condition (charge condition) of the battery 1 and the automobile mode; the table 3 is a table indicative of a control voltage $V_{BC}$ applied to the battery 1 at the normal condition, depending upon the conditions of the battery 1 and the battery temperature, and the table 4 is a table representative of variations in setting the control voltage $V_{BC}$ during the normal operation as shown in the table 3, in response to the automobile mode.

① Normal Drive Operation

Figure 10:
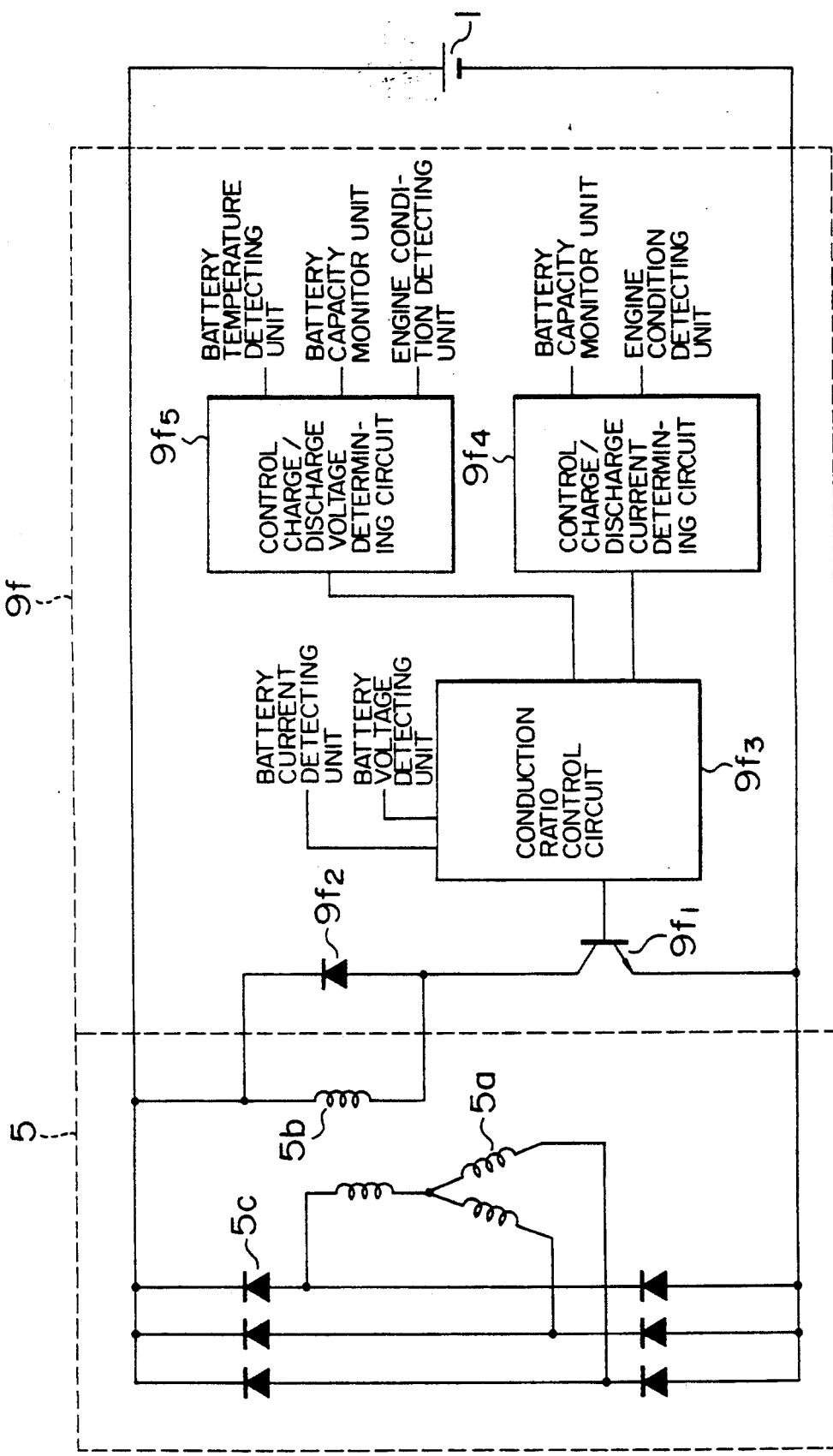
FIG. 10 is a schematic block diagram for showing the alternator controlling unit $9f$ indicated in FIG. 2 and the alternator 5 represented in FIG. 1.

As shown in FIG. 10, the alternator 5 includes an armature winding 5a, a field winding 5b and a fullwave rectifier 5c. An alternator control unit 9f is constructed of a transistor $9f_1$ for controlling a current flowing through the field winding 5b; a flywheel diode $9f_2$ connected across the field winding 5b; a conduction ratio control circuit $9f_3$ for controlling the conduction ratio of the transistor $9f_1$; a control charge/discharge current determining circuit $9f_4$ determining the control charge/discharge current $I_{BC}$; and a control voltage determining circuit $9f_5$ determining the control voltage $V_{BC}$.

Figure 11:
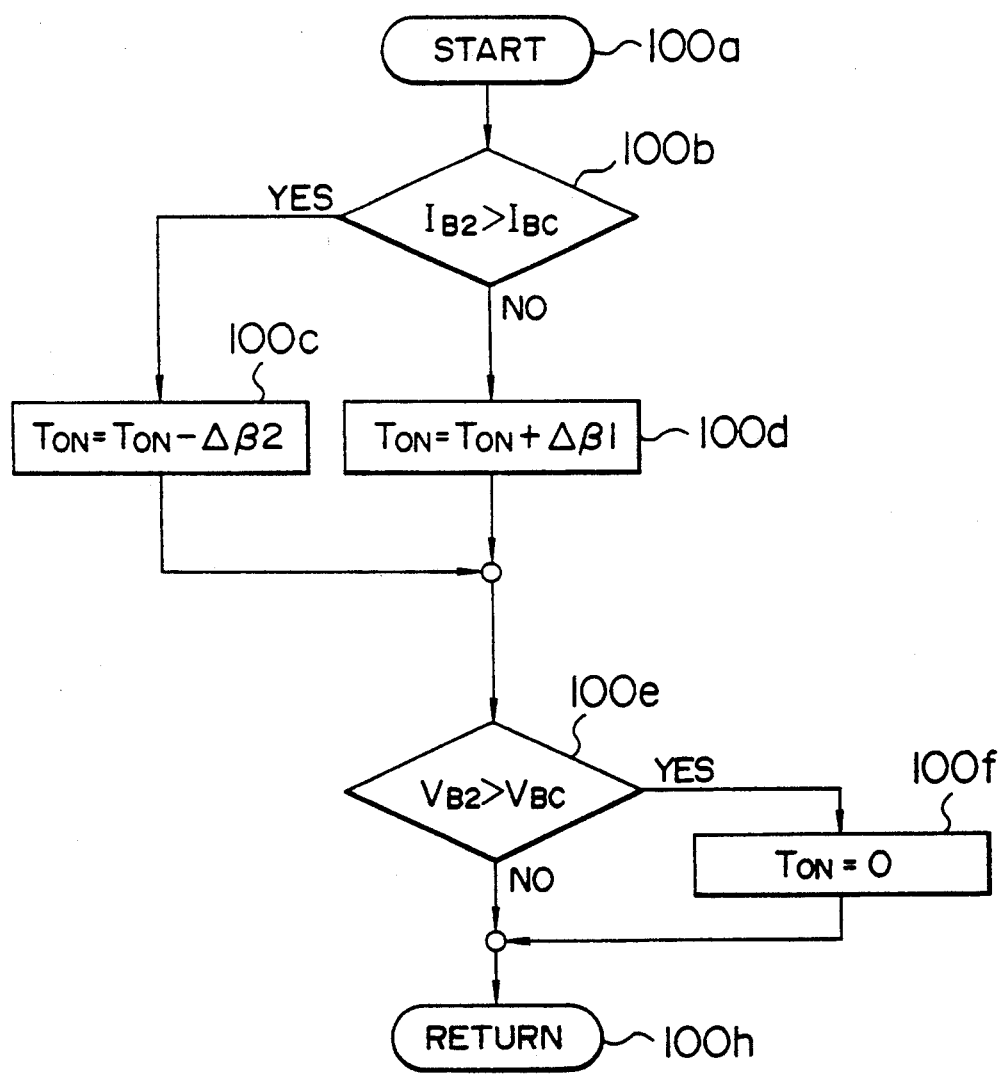
FIG. 11 is a flow chart for showing the process effected by the conducting ratio controlling circuit $9f_3$ during the normal drive.

Then, the operations will now be explained in accordance with a flow chart shown in FIG. 11. At a step 100b of this flowchart, the charge current $I_{B2}$ to the battery 1 is detected and this charge current $I_{B2}$ is compared with the control charge current $I_{BC}$ determined by the control charge current determining circuit $9f_4$. Then, in case when the charge current $I_{B2}$ is higher than the control charge current $I_{BC}$, an ON time $T_{ON}$ of the transistor $9f_1$ which has been stored at the present is reduced by $\Delta\beta_2$ at a step 100c. In case when the control charge current $I_{BC}$ is higher than the charge current $I_{B2}$, the ON time $T_{ON}$ of the transistor $9f_1$ which has been stored at the present is increased by $\Delta\beta_1$.

At a step 100e, the voltage $V_{B2}$ of the battery 1 is detected, and then this voltage $V_{B2}$ of the battery 1 is compared with the control voltage $V_{BC}$ determined by the control voltage determining circuit $9f_5$. Then, if the voltage $V_{B2}$ of the battery 1 is higher than the control voltage $V_{BC}$, the ON time $T_{ON}$ of the transistor $9f_1$ is selected to be zero so as to interrupt the operation of the alternator 5 at a step 100f, so that the overcharge to the battery 1 is prevented, or the problem given to the electric load, which is caused when the voltage of the battery 1 becomes too high, is prevented.

On the other hand, when the voltage $V_{B2}$ of the battery 1 is lower than the control voltage $V_{BC}$, the transistor $9f_1$ is brought into the conduction state for only the time $T_{ON}$ which has been determined at the previous step 100c or 100d. Then, a control loop (step 80, 90, 160, 100, 110 and 120) where the control for the drive operation is carried out, is supervised at a calculation period of 10 ms (step 170). Thus, the ON time is increased or decreased for a constant time ($\Delta\beta_1$ or $\Delta\beta_2$) every 10 ms, and the charge current of the battery 1 is adjusted in such a manner that the voltage of the battery 1 approaches the control charge current (a predetermined current) $I_{BC}$ at a predetermined velocity. (It is shown that the previously stated controls are executed by the battery current adjusting means, and is covered by the control of the conduction ratio control circuit $9f_3$).

Assuming now that the above-described initial capacity belongs to the good charge zone shown in FIG. 7, the upper limit capacity $VI_0$ is set to $VI_3+5$ (Ah) based on the table 1. Then, it is also assumed that this upper limit capacity $VI_0$ belongs to the good charge zone. At this time, since the second battery capacity $VI_0$ is under the good condition, the control charge current $I_{BC}$ is set to 5A, as represented in the table 2, by way of the control charge current determining circuit $9f_4$, and the control voltage $V_{BC}$ is set by way of the control voltage determining circuit $9f_5$, depending upon the temperature $T_{B2}$ of the battery 1. Then, the battery 1 is so controlled as to be continuously charged at the control charge current 5 Å.

When the battery 1 is charged at the above-described control charge current $I_{BC}$, the second battery capacity $VI_0$ starts to be increased, and then reaches the upper limit capacity $VI_0$, both the control charge current $I_{BC}$ and control voltage $V_{BC}$ are set by the control charge current determining circuit $9f_4$ and control voltage determining circuit $9f_5$ in such a manner that the control charge current $I_{BC}=0(A)$ and the control voltage $V_{BC}=12.8$ V, respectively, in the full charge zone shown in the table 1, and then the charging operation to the battery 1 is stopped and also the increase in the second battery capacity $VI_2$ is stopped.

Since the battery 1 is not charged thereafter, the battery discharges. When the second battery capacity $VI_2$ is decreased by a predetermined value from the upper limit capacity $VI_0$, the control charge current $I_{BC}$ and control voltage $V_{BC}$ are set to the corresponding control charge current and control voltage, depending upon the present conditions of the battery 1. In this example, as previously stated, since it is assumed that the upper limit capacity $VI_0$ belongs to the good charge zone, the control charge current $I_{BC}$ is equal to 5A and the control voltage $V_{BC}$ is equal to 14.0 V. Again, the charge operation of the battery 1 is commenced so that the second battery capacity $VI_2$ is recovered. Subsequently, the above-described condition is repeatedly controlled.

During the control for the normal drive operation, when the electric load 8 is heavy and the second battery capacity $VI_2$ is entered into the good charge zone, as shown in the table 2, the charge current to the battery 2 is set to zero (control charge current $I_{BC}=0$) and also the current supplied from the alternator 5 is supplied only to the electric load 8, so that power generated from the alternator 5 is lowered and the load control for increasing the fuel efficiency is carried out. At this time, when the battery 1 is gradually discharged and the second battery capacity $VI_2$ is reduced by a predetermined amount, the load control is released and the battery 1 is again charged.

Also, with respect to the above-described control, assuming now that only the upper limit capacity $VI_0$ is entered into the full charge zone, when the second battery capacity $VI_2$ is entered into the full charge zone, the battery 1 is controlled at the control charge current $I_{BC}$ and control voltage $V_{BC}$ defined under the full charge zone. Since this control is such that the battery 1 is not charged, it is possible to prevent the overcharge operation. On the other hand, when the battery capacity is reduced to the good charge zone due to the discharge operation, the present control is charged into the control for the good charge zone. When this control is entered into the full charge zone, this control again charged into the control for the full charge zone.

As a consequence, if the upper limit capacity $VI_0$ is set higher than the capacity (25 Ah) of the battery 1 defined when the control is changed into the control for the full charge zone, the battery 1 is not charged up to this upper limit capacity $VI_0$ during the normal drive operation. It should be noted that the control is changed into such a control capable of charging the battery 1 up to this upper limit capacity $VI_0$ during the deceleration control (will be discussed).

Also, the above-described load control is carried out only when the second battery capacity $VI_0$ under use is entered into the full charge zone and good charge zone.

(2) Idling operation (driving operation under which the engine is revoluted at a speed lower than a predetermined speed)

When the second battery capacity $VI_2$ is present other than the dangerous zone for battery charge, and also the light electric load 8 is charged into the heavy electric load 8 during the idling operation, power generation by the alternator 8 is delayed with respect to this change. As a result, since the charge current into the battery 1 is supplied to the electric load 8 if the battery 1 is being charged by the alternator 5 at this time, the charge current is temporarily reduced. If the battery 1 is not under charge, the current from the battery 1 is supplied to the electric load 8 so that the discharge current is temporarily increased. Such a rapid change in the battery current is detected by the current detector 6 so as to sense that the heavy electric load is loaded.

Conversely, in case that a condition where the electric load 8 is loaded (for instance, DUTY RATIO of the field coil current supplied to the field coil 5b is higher than 80%) is changed into another condition where this electric load 8 is cut out during the idle operation of the engine 2, since the current which has been supplied from the alternator 5 to the cut-out electric load 8 is temporarily supplied to the battery 1, the charge current is suddenly increased. The rapid change in decreasing the heavy electric load 8 is detected by detecting the rapid increase in this charge current by the current detector 6.

Figure 12:
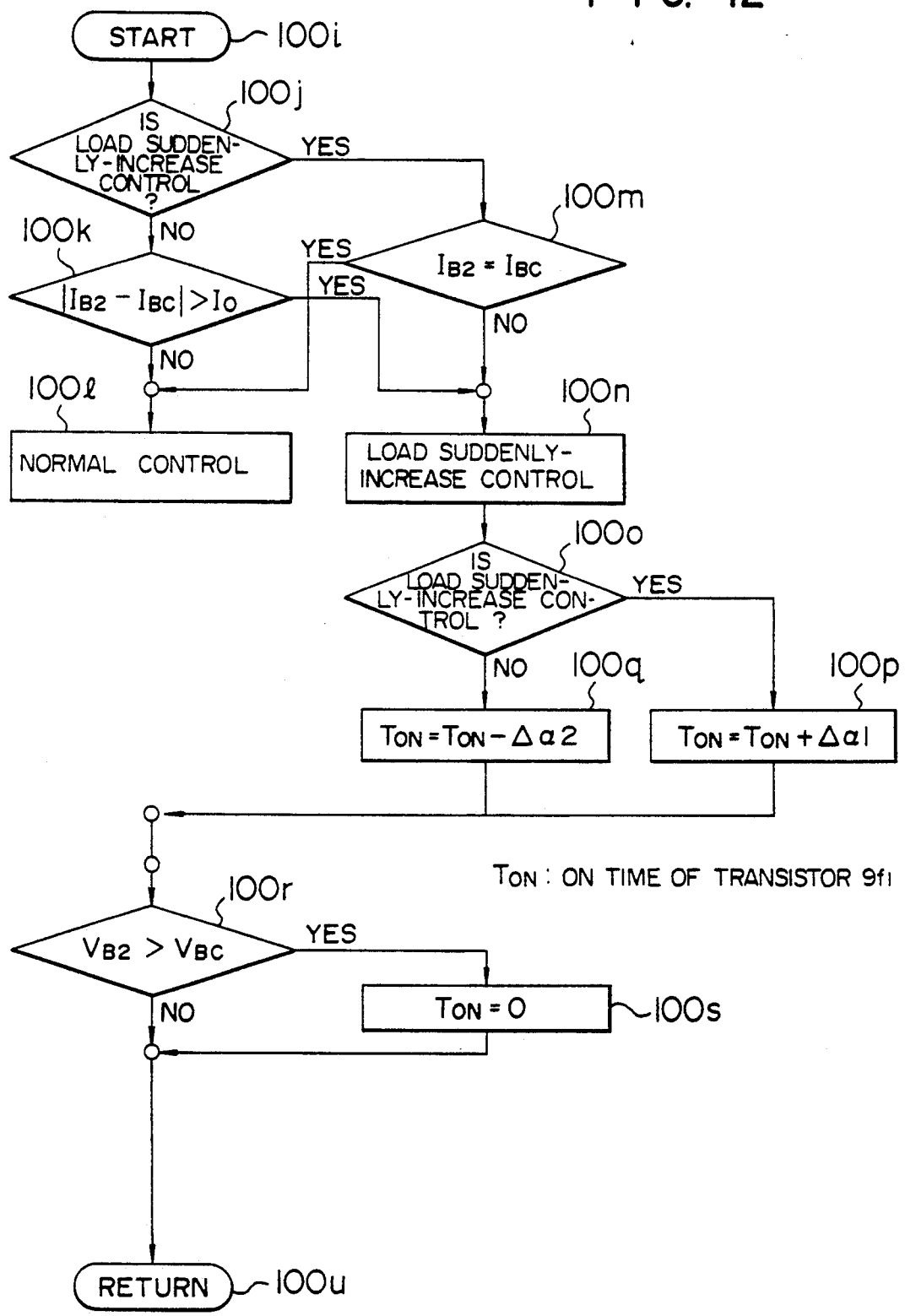
FIG. 12 is a flow chart for representing the process executed by the conducting ratio controlling circuit $9f_3$ during the idle drive.

The above-described controls performed when the load is suddenly increased or decreased (will be referred to as a "load suddenly change control") will now be explained with reference to a flow chart shown in FIG. 12.

At a first step 100j, a detection is made whether or not the load suddenly-change control is under operation at present time. Since this is cleared when an IG (ignition) switch (not shown) is turned ON, a detection is made of a difference between either the charge current or discharge current $I_{B2}$ of the battery 1, and the control charge current $I_{BC}$ thereof at the next step 100k.

As previously explained, since it is so controlled that either the charge current or discharge current $I_{B2}$ of the battery 1 approaches the control charge current $I_{BC}$ at a predetermined velocity, and is also controlled at a preselected velocity when the electric load 8 is loaded or interrupted, the alternator 5 cannot immediately respond to the variations in the electric load 8, resulting in a time delay. As a consequence, when the electric load 8 is increased, the current is supplied from the battery 1 to the electric load 8, whereas when the electric load 8 is decreased, the charge current is supplied from the alternator 5 to the battery 1, so that a difference between the current $I_{B2}$ of the battery 1 and the control charge current $I_{BC}$ becomes large.

Therefore, the discharge current is indicated by a symbol different from the symbol representative of the charge current, if an absolute value of the difference between the current of the battery 1 and the control charge current $I_{BC}$ is smaller than a preselected value $I_0$ (for instance, 15A), it is judged that there is no sudden change in the load, whereby the normal control is performed at a step 100l (As previously stated, the detection of the electric load 8 is carried out by the electric load detecting means, and it is shown in this preferred embodiment that this electric load detecting means is contained in the conduction ratio control circuit 9f3). This normal control is the same as the control effected under the above-described normal driving condition, the explanation of which is omitted.

Subsequently, a description will now be made of such a case that the electric load 8 is suddenly change. Once a detection is made that the absolute value of the difference between either the charge current or discharge current $I_{B2}$ of the battery 1 and the control charge current $I_{BC}$ at the step 100K from the normal control state, the load suddenly-change control is commenced at a step 100n. At this time, it is memorized that the control is under the load suddenly-change control. At a step 100o, a judgement is made that the electric load 8 is rapidly increased when $I_{B2} - I_{BC} < 0$, based on the difference between the current $I_{B2}$ of the battery 1 and the control charge current $I_{BC}$ which has been calculated at the previous step 100K, assuming now that the symbol of the charge current is, for instance, (+). At a step 100p, the ON time $T_{ON}$ of the transistor $9f_1$ is increased by $\Delta\alpha_1$ that is smaller than $\Delta\beta_1$ during the normal driving operation.

Here, a judgement is made that the electric load 8 is suddenly decreased if $I_{B2}-I_{BC}>0$, and the ON time $T_{ON}$ of the transistor $9f_1$ is decreased by $\Delta\alpha_2$ which is smaller than $\Delta\beta_2$ during the normal driving operation. Furthermore, at this time, as shown in the table 2, the control charge current $I_{BC}$ is set to 30A, the control voltage $V_{BC}$ is increased by 0.5 V as shown in the table 4, whereby it is so set that the amount of the charge into the battery 1 is increased.

Thereafter, the voltage $V_{B2}$ of the battery 1 is compared with the control voltage $V_{BC}$ at a step 100r, which is similar to the control performed during the normal driving operation, and only if the voltage $V_{B2}$ of the battery 1 is higher than the control voltage $V_{BC}$, the power generation by the alternator 5 is interrupted. Then, this control is carried out every 10 ms, which is similar to the control effected during the normal driving operation.

Thereafter, since it has been memorized that the control is performed under the load suddenly-change control at the previous calculation operation, the process is advanced to a step 100m at the step 100j, at which the charge current $I_{B2}$ of the battery 1 is compared with the control charge current $I_{BC}$. If both of the currents are equal to each other, it is judged that after the charge current is gradually increased or decreased by the load suddenly-change control, this charge current reaches the control charge current $I_{BC}$, and the control is performed under the normal control at a step 100l, and then at this time, it is memorized that the control is carried out under the normal control. If the charge current $I_{B2}$ of the battery 1 is not equal to the control charge current $I_{BC}$ at a step 100m, the load suddenly-change control is again performed at a step 100m. It should be noted that when the absolute value of the difference between the charge current $I_{B2}$ of the battery 1 and the control charge current $I_{BC}$ is equal to a preselected value, the normal control operation may be performed.

As previously stated, the problems such as engine stole may be prevented because the load on the engine 2 is suddenly increased, by surely detecting such a case that the electric load 8 is loaded during the idling operation, by gradually increasing the field current of the alternator 5 at this time instant so as to gradually increase the power generated by the alternator 5, whereby it may be avoided that the load loaded on the engine 2 is suddenly increased.

Conversely, the problems such as an increase in the engine revolution may be prevented because the load given to the engine 2 is suddenly decreased, by surely detecting such a case that the electric load 8 is interrupted during the idling operation, by gradually decreasing the power generated by the alternator 5 at this time instant, during which the charge current to the battery 1 is increased, whereby it may be avoided that the load given to the engine 2 is suddently decreased.

It should be understood that when DUTY RATIO of the field current of the alternator 5 which flows through the field coil 5b is higher than 90% and then the electric load 8 is loaded on the engine, the field current means not be gradually increased.

③ Acceleration

When the engine is accelerated during the drive operation, the fuel intake pressure is increased, which is detected. As represented in the above-described tables 2 and 4, in case that the second battery capacity $VI_2$ during the drive operation is entered into either the full charge zone or the good charge zone, the control voltage $V_{BC}$ is set to such a control voltage lower than the control voltage $V_{BC}$ by 2 V which has been set before the acceleration, and also the control charge current $I_{BC}$ is set to O(A), so that the power generated by the alternator 5 is decreased and the acceleration characteristic is improved.

On the other hand, if the condition of the battery 1 is under the no good condition or the dangerous condition, the charge operation must be continued, so that even during the acceleration, the control operation by the control voltage $V_{BC}$ and control charge current $I_{BC}$ which have been set before the acceleration is continued.

④ Deceleration

When an automobile is decelerated during drive operation, or driven on a down slope, as shown in the tables 2 and 3, the control charge current $I_{BC}$ is set to 30A. In case that the second battery capacity $VI_2$ is entered into the full charge zone, 2.2 V is added to the control voltage $V_{BC}$ which has been set before the deceleration condition. In case that the second battery capacity $VI_2$ is entered into the good charge zone, 1.0 V is added to the above-described control voltage $V_{BC}$, and in case that this battery capacity is entered into the no good charge zone, 0.5 V is added to this control voltage $V_{BC}$. Furthermore, the control voltage $V_{BC}$ is set to 15 V and also the upper limit capacity $VI_0$ of the second battery capacity $VI_2$ during the drive operation is changed to a value to which the correction value "C" for instance 5 (Ah), is added. Thus, the power generated by the alternator 5 is increased by charging the battery 1, the engine break is made great in order to support the deceleration operation, and also the energy produced during the deceleration operation is regenerated thereby to charge the battery 1.

On the other hand, when the second battery capacity $VI_2$ is entered into the dangerous zone for the battery, if the control charge current $I_{BC}$ and control voltage $V_{BC}$ are set to values higher than the values shown in the tables 2 and 3, the adverse influence might be given to the electric load 8, whereby these voltage/current setting changes are not performed.

Figure 13:
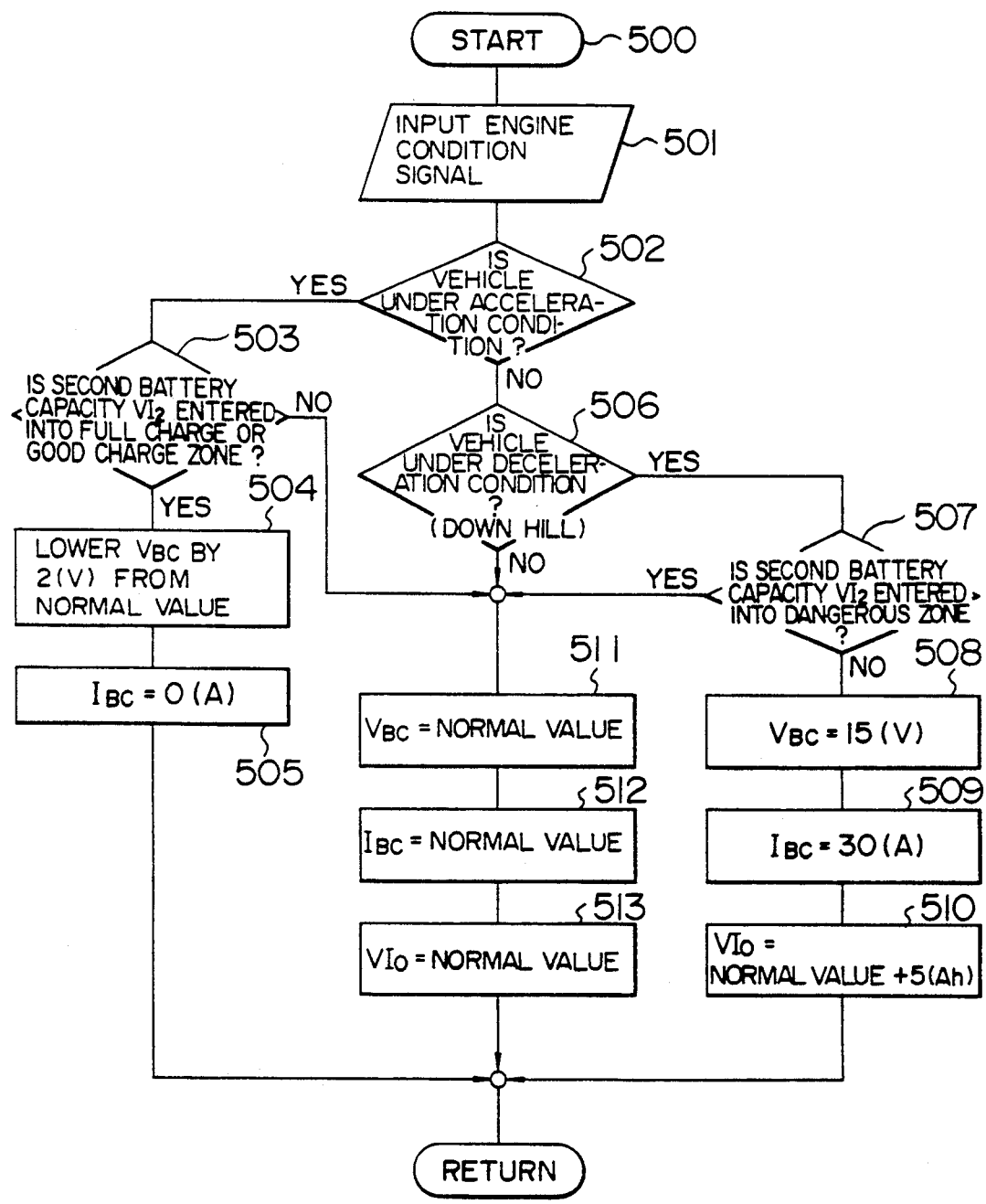
FIG. 13 is a flow chart for representing the process effected by the control circuit 9 which an automobile is accelerated, decelerated, and also driven on a down slope.

The above-described controls for the acceleration and deceleration operations will now be described with reference to FIG. 13. At a first step 501, an engine condition signal is inputted. The engine condition signal implies a positional sensor of a throttle valve and an air-intake pressure sensor of an intake manifold for an engine, by which signals representative of an acceleration condition, a deceleration condition and a down slope condition of an automobile may be detected. Subsequently, a judgement is made whether or not the vehicle is under the acceleration condition at a step 502. If the judgement result is sthat the vehicle is under the acceleration condition, a check is made whether the second battery capacity $VI_2$ during the drive operation is entered into the full charge zone or good charge zone at a step 503. Then, if the judgement result is made that the second battery capacity $VI_2$ is entered into either the full charge zone or good charge zone, as represented in the above-described table 4, the control voltage $V_{B2}$ is lowered by 2 V at a step 504, and the control charge current $I_{BC}$ is set to O(A) at a step 505.

On the other hand, when it is judged that the vehicle is not under the acceleration condition at the above step 502, another check is made whether or not the vehicle is under the deceleration condition or down slope driving condition at a step 506. Then, if a judgement is made that the vehicle is under the deceleration condition or down slope driving condition, a check is made whether or not the second battery capacity $VI_2$ is entered into the dangerous zone at a step 507. If a judgement is established that the second battery capacity $VI_2$ is not entered into the dangerous zone, the control voltage $V_{BC}$ is set to 15 V at a step 508 and the control charge current $I_{BC}$ is set to 30 (A) at a step 509. At a next step 510, the upper limit capacity $VI_0$ of the battery capacity $VI_2$ is increased to 5 (Ah).

Then, in case that the vehicle's condition is out of the above-described condition, the control charge current $I_{BC}$, control voltage $V_{BC}$ and upper limit capacity $VI_0$ are set to normal values at steps 511 to 513. To avoid overcharge conditions of the battery 1, the above-described period during which the upper limit capacity $VI_0$ is increased under the above-described deceleration operation, may be restricted within a predetermined time period from commencement of the deceleration operation.

Referring back to FIG. 3, in this preferred embodiment, if the second battery capacity $VI_2$ is lower than the setting value of the dangerous zone at a step 110, then warning against dead battery is made by the alarm unit 9i. As previously described, the step 170 sets up the calculation period of 10 ms.

Then, it is judged that the key switch is turned off at a step 120, the final value of the second battery capacity $VI_2$ is stored as a third battery capacity $VI_3$ in the battery capacity monitor unit 9, whereby the subsequent drive operation is prepared.

Second Preferred Embodiment

In the above-described first preferred embodiment, when the gassing is detected, the upper limit capacity was set in such a manner that the capacity increased amount "A" which has been set to each zone to which the initial amount of the battery belongs, is added to the initial capacity and the correction value depending on the gassing amount (for instance, gassing amount ×0.8) is subtracted therefrom. To the contrary, in accordance with a second preferred embodiment, a value calculated by subtracting a gassing amount presently detected from the maximum value of the second battery capacity $VI_2$ during the previous drive operation is regarded as an optimum valve of the battery capacity, which will be employed as the upper limit capacity which has been explained in the first preferred embodiment.

Figure 14:
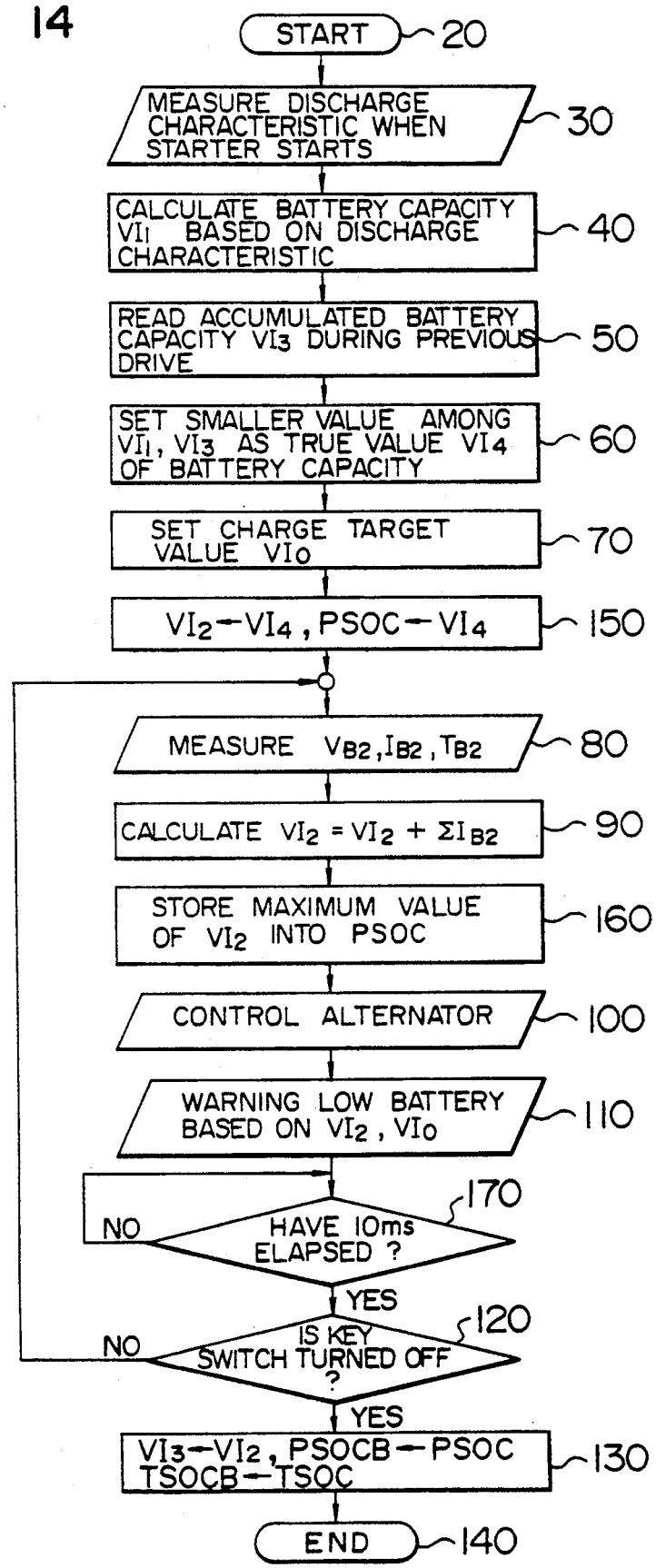
FIG. 14 is a flow chart for representing the process executed by the control circuit according to the second preferred embodiment.
Figure 15:
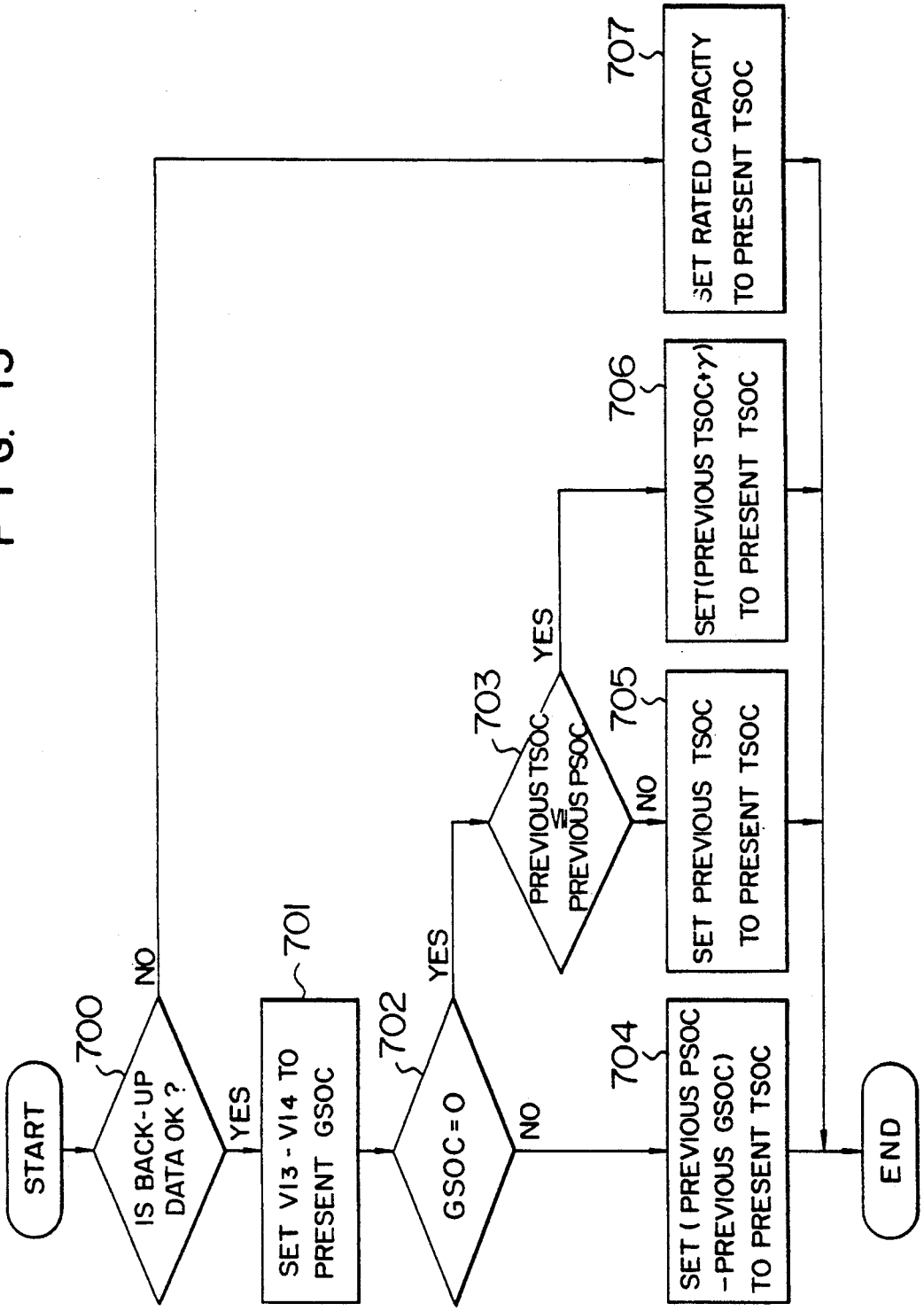
FIG. 15 is a flow chart for representing the process of the step 70 shown in FIG. 13, more in detail.

The second preferred embodiment will now be explained with reference to FIGS. 14 to 18. FIG. 14 is a flow chart for indicating a control performed in the control circuit 9; FIG. 15 is a flow chart for representing in detail, the process defined at the step 70 of the flow chart shown in FIG. 14; FIG. 16 is a characteristic diagram for showing transition of capacities of the battery 1 from the commencement of the vehicle's drive to the end of the drive operation; FIG. 17 is a characteristic diagram for analogously representing the characteristic of the charge efficiency for the battery 1; and, FIG. 18 is a characteristic diagram for representing the actual charge efficiency of the battery.

In FIG. 14, since the processes defined from the steps 20 to 60 are identical to those shown in FIG. 3 of the first preferred embodiment, the explanation thereof is omitted. A step 70' is such a process to calculate an optimum value TSOC of the battery 1. To explain this calculation more in detail, a check is made at a step 700 shown in FIG. 15, whether or not both a maximum value PSOCB of the second battery capacity $VI_2$ during the previous drive operation and a optimum value TSOCB which has been calculated during the previous drive operation (which have been stored in the battery capacity monitor unit 9g), are invalidated due to some reasons such as a failure in the power supply back-up. When it is judged that these maximum data PSOCB and TSOCB are invalidated, the present maximum value TSOC is set to a rated capacity at a step 707. This is because the major reasons of the back-up failure are caused by changing the battery 1. However, if the value is set to the actual maximum capacity of the battery 1, there are possibilities to cause the adverse influence such as the overcharge operation, so that this value may be set to approximately 50% of the rated capacity.

At a step 700, if a judgement is made that the back-up data is valid, an amount of gassing GSOC (referred to as an "invalid charge capacity") is calculated at a step 701.

A description will now be made based on the transition of the battery capacity shown in FIG. 16. Symbol "g" shown in FIG. 16 indicates an initial capacity $VI_4$ during the previous drive operation. Then, as previously stated, the later charge/discharge currents is multiplied with this initial capacity $VI_4(g)$ so as to obtain the second battery capacity $VI_2(e)$ during the drive operation. This is performed by the process defined at the step 90 shown in FIG. 3 of the first preferred embodiment. Symbol "f" indicates the transition of the practical battery capacity in which the charge efficiency has been considered. As shown in FIG. 17, when the actual battery capacity exceeds the optimum value TSOC (d) of the battery 1, since the charge efficiency becomes 0%, the battery 1 is not charged. Since the characteristic of the charge for the battery is approximated, the maximum value is equivalent to the optimum value TSOC. On the other hand, since the second battery capacity $VI_2(e)$ is obtained, taking account of the charge efficiency, even when it exceeds the optimum value TSOC (d), the multiplication where the charge efficiency is 100% is continued and the this capacity is calculated as being higher than the optimum value TSOC (d). In other words, the capacity higher than the optimum value TSOC (d) corresponds to the invalid charge capacity GSOC. Symbol "b" denotes a third battery capacity $VI_3$, and is a final value of the second battery capacity $VI_2(e)$ which has been accumulated by involving the invalid charge capacity GSOC during the previous drive operation. On the other hand, the initial capacity $VI_4$ during the previous drive operation must be coincident with the fianl value (a) of the transition (f) of the actual battery capacity at the previous drive operation. As a result, it may be understood that the invalid charge capacity GSOC during the previous drive operation is represented by "h" corresponding to the difference between the third battery capacity $VI_3(b)$ and the actual battery capacity (=initial capacity $VI_4$ during the previous drive operation) (a). As a result, at a step 701, the difference between the third battery capacity $VI_3$ and the initial capacity $VI_4$ during the previous drive operation is understood as the invalid charge capacity GSOC during the previous drive operation.

At a step 702, a check is made whether or not the invalid charge capacity GSOC is equal to "0". If the invalid charge capacity GSOC is not equal to "0", then the optimum value TSOC is calculated at a step 704. It should be noted that the condition where the invalid charge capacity GSOC becomes zero corresponds to such a case that the charge/discharge operations during the previous drive operation are performed in a region where the charge efficiency is lowered and no gassing occurs. Here, the invalid charge capacity GSOC during the previous drive operation is a value "$h_3$" obtained by adding "$h_1$" and "$h_2$" with each other as shown in FIG. 16. The invalid charge capacity GSOC corresponds to the difference "$h_3$" between the maximum value PSOC (c) of the second battery capacity $VI_2$ and the optimum value TSOC (d) even when the battery 1 is charged/discharged under any types of patterns. As previously stated, the invalid charge capacity GSOC during the previous drive operation has been calculated at the step 701, and then the invalid charge capacities GSOC which have been obtained by these two methods are equal to each other. As a result, the optimum value TSOC of the battery 1 is calculated at a step 704 by subtracting the invalid charge capacity GSOC obtained at the step 701 from the maximum value PSOC of the second battery capacity $VI_2$ during the previous drive operation.

On the other hand, when a judgement is made that the invalid charge capacity GSOC is equal to zero at the step 701, the maximum capacity TSOCB which has been calculated during the previous drive operation at the step 703 is compared with the maximum value PSOCB of the second battery capacity $VI_2$ during the previous drive operation. If it is judged that PSOCB$\geq$TSOCB, then it implies that although the battery 1 has been charged up to the optimum value TSOC which has been calculated during the previous drive operation, no gassing occurs. In other words, it implies that the battery is charged in the region where the charge efficiency is equal to 100%. As a consequence, it may be judged that the optimum value TSOCB which has been calculated during the previous drive operation was a value lower than the actual optimum value. Therefore, the present optimum value TSOC is corrected as the previous optimum value TSOCB+$\gamma$ at a step 706. This correction value "$\gamma$" may be selected to be a fixed value such as 1 (Ah), or be a value calculated under the charge condition.

As previously described in the first preferred embodiment, the calculated optimum value TSCO corresponds to the upper limit capacity $VI_0$. During the vehicle's drive operation, the battery 1 is charged up to this optimum value TSOC as a target. AS previously stated in connection with the first preferred embodiment, also in the second preferred embodiment, when the second battery capacity $VI_2$ during the drive operation reaches the optimum value TSOC (the upper limit capacity $VI_2$ in the second preferred embodiment), such a control that the charge current to the battery 1 is set to zero is basically performed. Therefore, the above described correction of the optimum value TSOC is carried out. However, in such a case that, for instance, even when the second battery capacity $VI_2$ reaches the optimum value TSOC, such a control of capable of still charging the battery 1 may be effected, it may be conceived such a case that the second battery capacity $VI_2$ during the second drive operation exceeds the previously determined optimum value TSOCB and also when the present invalid charge capacity GSOC is calculated, it was zero. In this case, since a judgement may be made that the optimum value TSOCB which has been calculated during the previous drive operation was smaller than the actual optimum value TSOC is substituted by the maximum value PSOCB of the second battery capacity $VI_2$ during the previous drive operation, or the maximum capacity PSOCB+$\gamma'$.

On the other hand, if a judgement is made that PSOCB<TSOCB at the step 703, the present optimum value TSOC is set to the previous optimum value TSOCB.

It should be noted that in such a case when the invalid charge capacity GSOC caused by the gassing is detected in this preferred embodiment, the optimum values are independently calculated during the drive operation. However, since there are errors in the measurements in the actual vehicles, it is useful to employ such a method for weighting the previous optimum value TSOCB and averaging the weighted maximum capacities.

In the above-described embodiments, the description was made that the characteristics of the battery charge efficiency were analogous to the characteristic shown in FIG. 17. However, in the actual case, as shown in FIG. 18, the battery charge efficiency has such a characteristic that the charge efficiency is gradually lowered from the approximately maximum capacity of the battery (i.e., about 80% of the maximum capacity). Thus, in accordance with the second embodiment, the optimum value TOSC is a value between a point (L or L') where the efficiency begins to be lowered and the maximum capacity. Whereas, a difference between the battery capacity at the point (L or L') on the efficiency begins to be lowered and the maximum capacity is equal to on the order of 20% of the rated capacity (4 to 6 Ah). As a consequence, taking account of this fact, the maximum capacity may be readily calculated.

In accordance with such a control that the second battery capacity $VI_2$ does not exceed the optimum value TSOC, when the optimum value TSOC is repeatedly calculated in response to repetitions of the vehicle drive operation, the optimum value TSOC is converged into a point where no gassing happens to occur completely (i.e., a point where the charge efficiency is equal to 10%, an L-point or L'-point shown in FIG. 18). That is to say, the optimum value TSOC represents a limit capacity where the battery 1 can be charged at 100% of charge efficiency. As a result, under such a condition that the battery capacity is belower than the optimum value TSOC, there is an advantage that when the battery is charged, there is no gassing, and the second battery capacity which has been calculated by the accumulated value of the charge/discharge currents of the battery 1 does not contain therein the errors caused by the gassing, whereby the capacity of the battery may be correctly calculated. Further, in the case where a control that charges the battery more than the optimum value TSOC is executed; since, it is known that the charge-efficiency begins to be lowered at the region beyond the optimum value TSOC; it is possible to keep the calculation without decrease in accumulation accuracy, by utilizing arrangement that accumulates value of the currents with considering the charge-efficiency beyond the optimum value.

As previously described, when the upper limit capacity $VI_0$ is calculated at the step 70, the initial values of the respective variables are set at a step 150. In this case, the initial capacity $VI_4$ obtained at the step 60 is substituted as the initial values of the second battery capacity $VI_2$ and maximum value PSOC during the drive operation.

Since the steps 80 to 120 indicative the control during the drive operation are the same as in the first preferred embodiment, no further explanation thereof is omitted. It should be noted in this second preferred embodiment that when the second battery capacity $VI_2$ of the battery 1 exceeds the optimum value TSOC during the drive operation, the battery is not charged in order that both the control charge current $I_{BC}$ and control voltage $V_{BC}$ are set to those as defined in the full charge condition shown in the tables 2 and 3. Then, since the batteries 1 is charged in the range where the charge efficiency is always 100%, there is no possibility that the gassing happens to occur and also no invalid charge capacity is contained in the accumulated value, precision in detecting the battery 1 may be considerably improved. It should be noted that the warning for the low battery performed at the step 110 may be executed when the optimum value TSOC is lowered to a certain value (for example, 30% of the rated capacity).

The function of the step 160 is to store the maximum value of the second battery capacity $VI_2$ during the drive operation as "PSOC" in the battery capacity monitor unit 9g. Thus, the maximum values PSOC of the second battery capacities $VI_2$ that vary from time to time are continuously stored. The step 170 is to set a calculation period of 10 ms.

At the step 120, if a judgement result is made that the key switch is turned off, the final value of the second battery capacity $VI_2$, the maximum value PSOC of the second battery capacity $VI_2$, and the optimum value TSOC are stored as the third battery capacity $VI_3$, PSOCB, and TSOCB, respectively, in the battery capacity monitor unit 9g, and then the system is prepared for the next drive operation.

As previously described, in accordance with the second preferred embodiment of the charge control apparatus of the present invention, since the maximum capacities of the battery can be continuously grasped, the battery is not charged with the capacity higher than the maximum capacity thereof in order to prevent the overcharge oepration, and also it can be easily judged both the deterioration and lifetime of the battery. Furthermore, since the optimum value is calculated at the limit capacity where the charge-efficiency is 100%, the battery is not charged but the correct battery capacity may be calculated with employment of the accumulated value of the charge/discharge currents for the battery within the region where the charge efficiency is lowered.

Also as explained above, in accordance with the preferred embodiments of the charge control apparatus of the present invention, since the condition (degree of deterioration) of the battery is detected when the vehicle starts to drive and then the upper limit capacity for charging the battery in response to this detected condition is set, the battery is not overcharged during the drive operation but can be charged under proper charge conditions. Then, since when the vehicle is driven under deceleration condition or along the (down slope, both the control voltage and control charge current are increased to a certain current by which the electric load is not adversely influenced, and also the upper limit capacity is increased depending on the battery conditions detected when the vehicle states to drive, the regeneration effect may be achieved, taking account of the battery conditions.

Current Detection Apparatus

A current detection apparatus suitably employed in the present invention will now be described.

As the conventional technique for measuring charge/discharge currents of a battery mounted on a vehicle, a shunt resistor is inserted into a bus line and a bus line current is calculated based upon a voltage drop across this shunt resistor. There is a problem that the bus line must be electrically cut so as to insert the shunt resistor into the bus line.

As a consequence, in a current detection apparatus according to this preferred embodiment, it comprises: a magnetic core having a gap; a first winding passing through the magnetic core and magnetically intersected with a bus line connected to a terminal of a battery and also the magnetic core; a magnetic sensor arranged between the gap, for generating an output in response to a magnetic flux produced within the magnetic core; a second winding magnetically intersected with the magnetic core, through which a predetermined current flows; and also a magnetic balance controller for causing a balance current to flow through the first winding, said balance current having such a magnitude to produce a magnetic flux so as to cancel magnetic fluxes generated by charge/discharge currents of the battery flowing through the bus line and also by said predetermined current, whereby a current flowing through the bus line is obtained based upon the magnitude of this balance current. As a result, the magnitude of the bus line current can be measured without electrically cutting the bus line.

The magnetic fluxes are generated in the magnetic core by the bus line current of the bus line and the predetermined current of the second winding.

The magnetic sensor produces the output, depending on the magnetic flux generated in the closed magnetic path of the magnetic core.

The magnetic balance controller causes the balance current to flow through the first winding, by which such a magnetic flux is produced for capable of canceling the magnetic fluxes produced by the bus line current and the predetermined current based upon the output from the magnetic sensor.

The bus line current may be grasped by converting the magnitude of the balance current into the magnitude of the voltage by the resistor and by measuring this voltage.

A concrete arrangement of the current detection apparatus according to a preferred embodiment of the present invention will now be described with reference to FIGS. 19, 20, 21 and 22.

Figure 19:
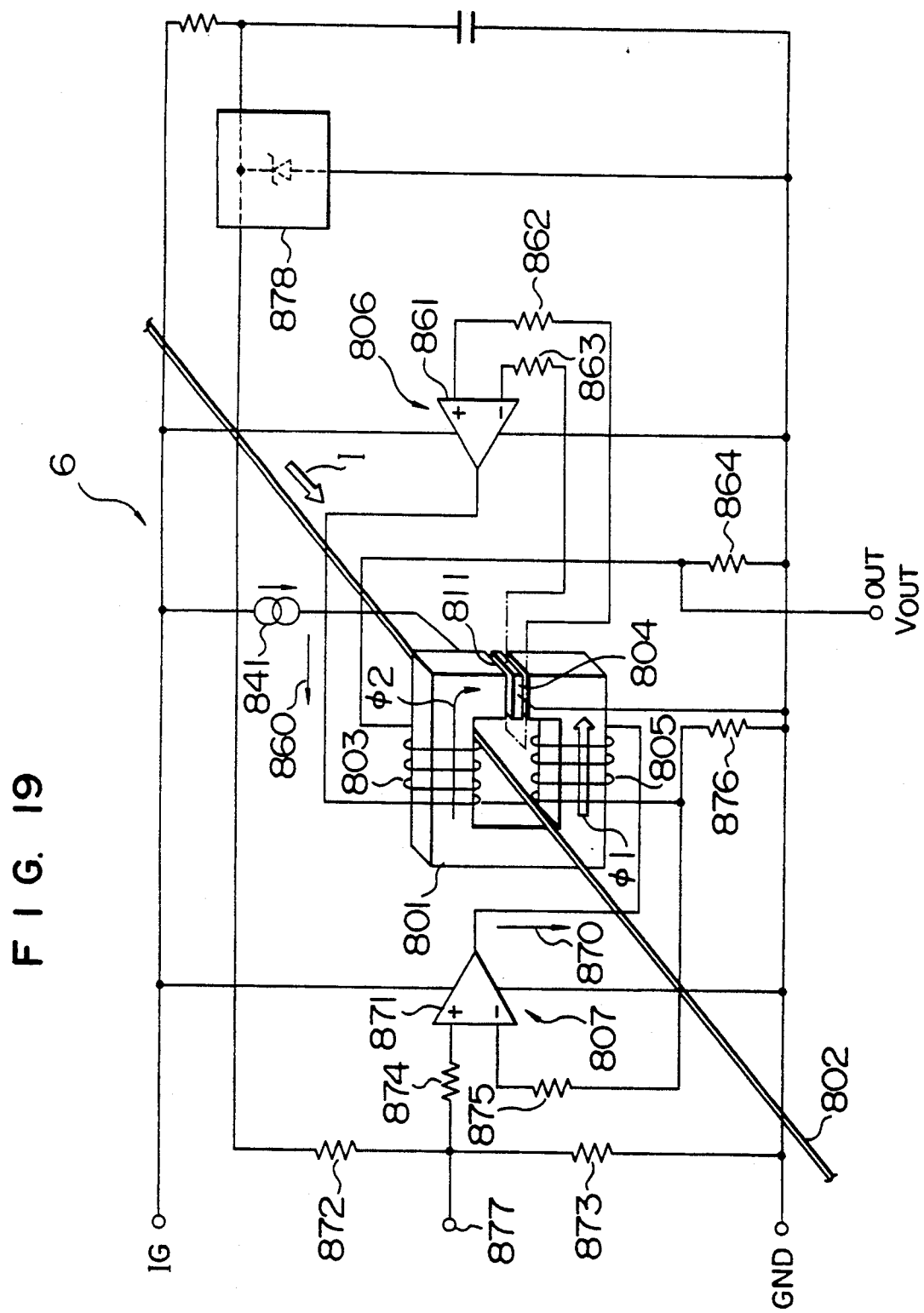

The current detection apparatus 6 shown in FIG. 19 comprises: an iron core 801, an electric wire 802 functioning as a bus line passing through this iron core 801; a first winding 803 wound on the iron core 801; a Hall element 804; a second winding 805 wound on the iron core 801 and a magnetic balance controller 806.

The iron core 801 is made of a C-type iron core having a gap 811 formed by laminating a thin-plate-like permalloy.

The electric wire 802 is such a wire (see FIG. 22) to electrically connect the battery 1 mounted on the vehicle and the vehicle body, and the number of insertion into the iron core 801 is one. There are possibilities that currents having-100A (maximum charge current) and 300A (maximum discharge current) flow through this electric wire 802.

The first winding 803 is formed in such a manner that, for instance, a conducting wire is wound on the iron core 801 by 1000 turns, and an output resistor 864 having a resistance value of 10 Ω is connected.

The Hall element 804 corresponds to a Hall generator made of such a semiconductor as Ge, InAS and InSb, and generates the output corresponding to the magnetic flux produced in the iron core 801. Reference numeral 841 indicates a constant current source for driving the Hall element 804.

Figure 20:
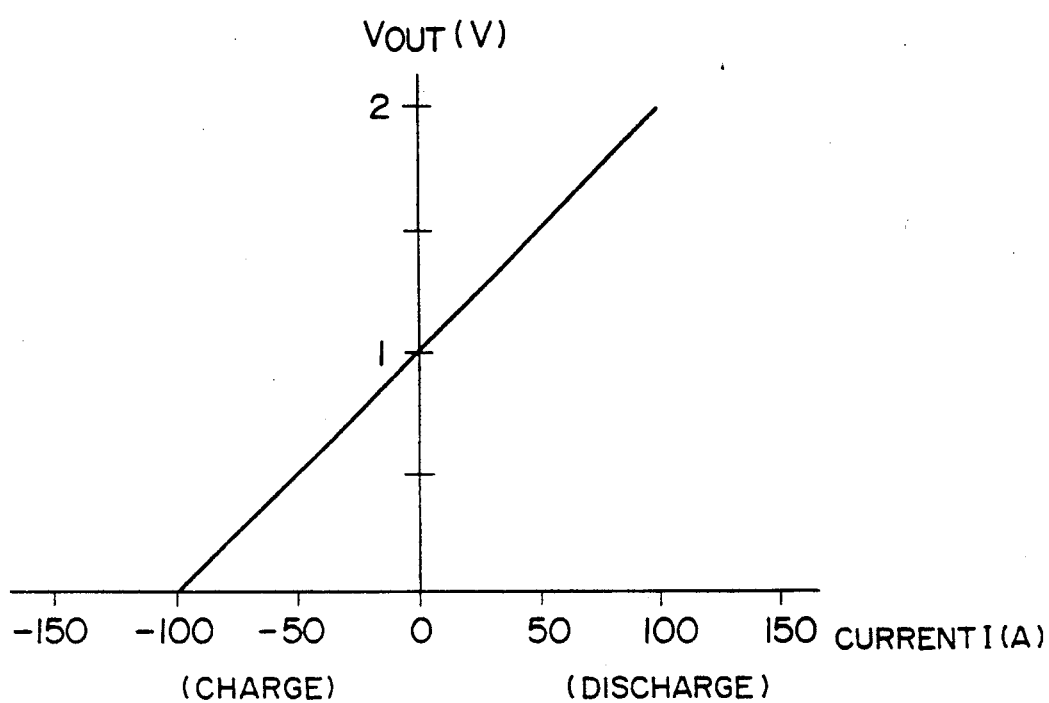
Figure 21:
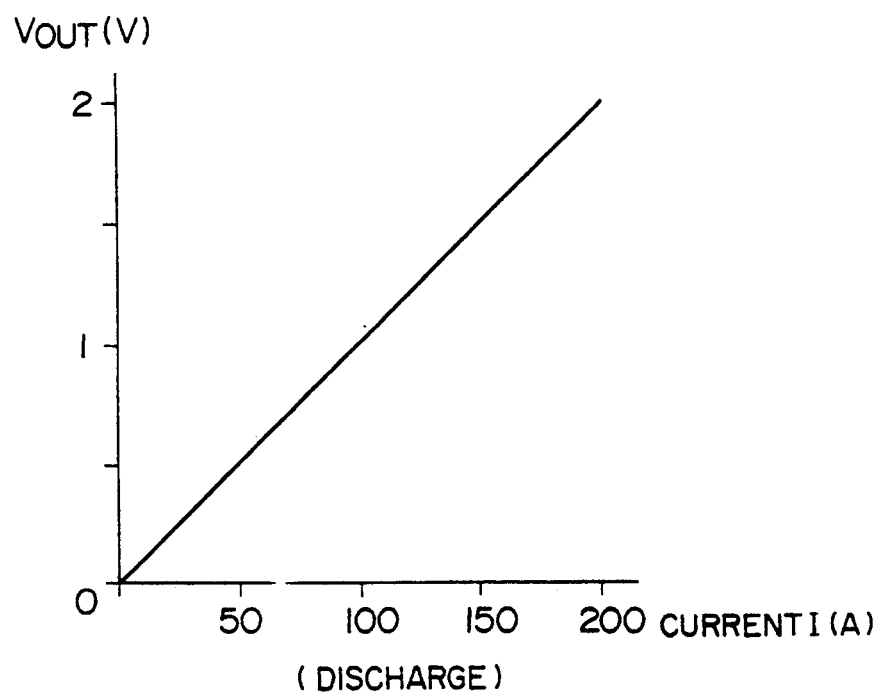

The second winding 805 is formed in such a manner that, for instance, a conducting wire is wound on the iron core 801 in a direction opposite to that of the first winding 803 by 1000 turns, and a resistor 876 having a resistance value of 10 Ω is connected, through which a predetermined current 870 is caused to flow by a bias control circuit 807. This bias control circuit 807 is arranged by an operational amplifier 871 and resistors 872 to 876 in this preferred embodiment, is connected to a terminal GNP, so that the function of the second winding 805 is released, and also is equipped with a control terminal 877 for varying a characteristic as represented in FIG. 20 into a characteristic as shown in FIG. 21. It is so designed that even when the voltage of the battery 1 is changed by a low voltage circuit 878, the predetermined current 870 does not change at all.

The magnetic balance controller 806 is constructed of an operational amplifier 861 and resistors 862 to 864, and has such a function to cause a balance current 860 having a magnitude to the first winding 803, by which a magnetic flux $\phi2$ is produced so as to cancel a magnetic flux $\phi1$ generated by the current I and the predetermined current 870 based upon the output of the Hall element 804.

Subsequently, a charge apparatus for an automobile, employing the current detection apparatus 6 will now be explained with reference to FIG. 22. It should be noted that since an arrangement of FIG. 22 is substantially identical to that of FIG. 1, the same circuit elements therein will be indicated by the same reference numerals.

Figure 22:
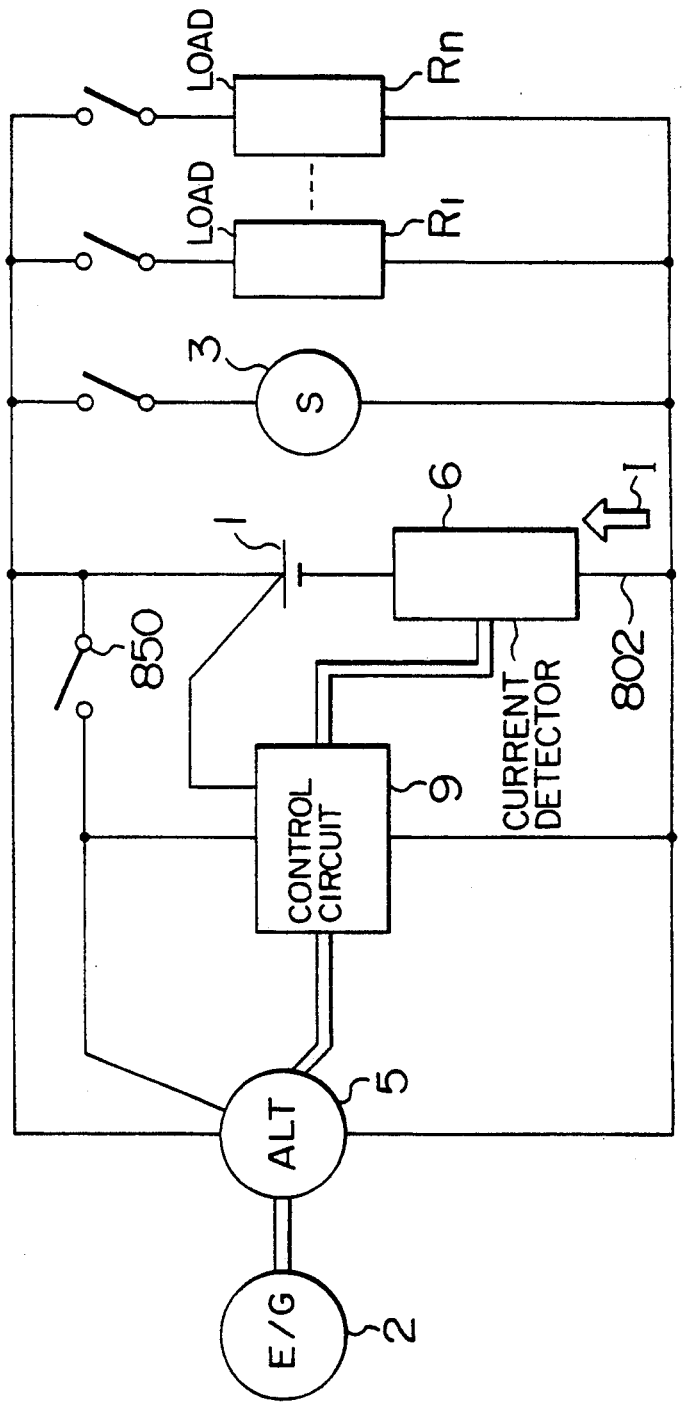

In FIG. 22, symbol E/G indicates an engine; symbol ALT denotes an alternator coupled with the engine E/G by way of a belt; reference numeral 9 represents a control circuit having a calculation circuit; reference numeral 1 indicates a battery; symbol S denotes a starter; symbols $R_1$ to $R_n$ indicate electric loads; and reference numeral 850 is an ignition switch.

Then, operations of the charge apparatus for the vehicle will now be described with reference to FIGS. 19 and 22.

Before Starts of Engine

The ignition switch 850 is turned on, and thus the voltage of the battery 1 is applied to the terminal IG of the current detection apparatus 6. It should be noted that the control terminal 877 is shortcircuited to the terminal GND by the control circuit, and the function of the second winding 805 is temporarily released.

Assuming now that the electric load $R_1$ is energized and the current I having a value of 10A flows through the electric wire 802.

The magnetic flux $\phi1$ is generated by the current I having the value of 10A which flows through the electric wire 802, within the closed magnetic circuit of the iron core 801.

The hall element 804 produces the output by this magnetic flux $\phi1$.

The magnetic balance controller 806 controls the balance current 860 in such a manner that the magnetic flux produced in the closed magnetic circuit becomes zero.

Here, an output voltage $V_{out}$ will be given as follows:

$$V_{out} = \text{(current } I/\text{turn number of first winding)} \times \text{output resistance of first winding}$$
$$= (10/1000) \times 10$$
$$= 0.1V.$$

Starter Starts

Basically, operations when the starter starts are similar to the above-described operations, the current I (pulsatory current) having values of 100A to 300A flows through the electric wire 802 by the operations of the starter S.

Here, an output voltage $V_{OUT}$ (note: pulsatory waveform) will be similarly obtained as follows:

$$V_{OUT} = (100\sim300/1000) \times 10$$
$$= 1\sim3V.$$

It should be noted that a detected current value of the current I when this starter S starts and the terminal voltage of the battery 1 at this time are supplied to the control circuit, whereby the capacity of the battery 1 before the vehicle is driven is calculated.

After Engine Starts

When the engine E/G is driven by starting the starter S, the alternator ALT commences its power generation and then values of the current I flowing through the battery 1 becomes either positive or negative, depending upon the generated current and the load current of the electric load $R_1/R_n$. It should be noted that the control terminal 877 is released by the control circuit in conjunction with starting the engine.

In accordance with this preferred embodiment, since the turn number of the second winding 805 is selected to be 1000 and the resistance 876 is 10 Ω, if the predetermined current 870 is selected to be 100 mA, as shown in FIG. 20, even if this current I is zero, the output voltage $V_{OUT}$ becomes 1 V, so that the measurement may be performed up to the output voltage $V_{OUT}=0$ V(I = −100A).

It should be noted that variations in the current values of the current I are supplied to the control circuit 9 in order to calculate variations in the electric capacity of the battery 1.

Then, the particular advantages of the current detection apparatus 6 and the charge apparatus for the automobile, employing the current detection apparatus 6 will now be explained.

(a) Since even when the current of the bus line becomes zero, a predetermined current is supplied to the second winding so as to produce the magnetic flux in the closed magnetic core, the value of the current I across a zero current point may be readily obtained from the output voltage $V_{OUT}$ without electrically cutting the bus line.

(b) Since the polarity of the output from the magnetic sensor and the polarity of the balance current are not changed within the measurement range, the current detection apparatus may be driven by a single power source, and therefore is suitable for automobiles.

(c) The current detection apparatus is equipped with the control terminal 877. This control terminal 877 is connected to the terminal GND so that the function of the second winding 805 is released. Thus, the measuring range may be changed.

(d) Since the electric capacity of the battery 1 is continuously grasped by the control circuit 9, both the over discharge and overcharge for the battery 1 may be prevented.

In the current detection apparatus according to the present invention, the magnetic sensor may employ a magnetic resistance element and the like other than the Hall element. Then, to reduce the adverse influences caused by the external magnetic fields such as earth magnetism, gaps may be uniformly formed in the magnetic core, into which the magnetic sensor is inserted, whereby the magnetic balance may be controlled based upon a synthesized output of these magnetic sensors. It should be understood that turn numbers of the first and second windings may be determined to proper values, depnding on the magnitude of the bus line current.

While particular embodiments of the present invention have been shown and described, it will be obvious to those skilled in the art that various changes and modifications may be made without departing from the present invention in its broader aspect.

We claim:

1. A charge control apparatus for a vehicle comprising:
   a starter driven by a battery mounted on a vehicle, for starting an engine;
   an alternator for the vehicle, driven by said engine, for charging said battery;
   battery current detecting means for detecting charge/discharge currents of said battery;
   battery voltage detecting means for detecting a terminal voltage of the battery;
   battery current accumulating means for accumulating the charge/discharge currents of said battery which have been detected by said battery current detecting means;
   first battery capacity detecting means for detecting a first battery capacity based on the terminal voltage of the battery when the charge current of said battery detected by said battery current detecting means reaches a predetermined value during commencement of said starter;
   second battery capacity detecting means for detecting a second battery capacity by adding the charge/discharge currents accumulated by said battery current accumulating means after the detection of the first battery capacity to an initial capacity;
   initial capacity setting means for comparing the first battery capacity with a previously detected second battery capacity, for setting as the initial capacity of the battery the smaller of the first battery capacity and the previously detected second battery capacity, and for setting the first battery capacity as the initial battery capacity when the previously detected second battery capacity fails to exist;
   target value setting means for setting a target value of the battery after the engine has started in response to the initial capacity; and
   generation controlling means for controlling power generated by the alternator for the vehicle in such a manner that said battery is charged at the target value set by said target value setting means.

2. A charge control apparatus for a vehicle as claimed in claim 1, wherein said target value setting means adds a second predetermined value to the initial capacity to obtain the target value.

3. A charge control apparatus for a vehicle as claimed in claim 2, wherein the target value setting means determines the second predetermined value based on a condition of the battery as indicated by the initial capacity.

4. A charge control apparatus for a vehicle, according to claim 3, further comprising battery temperature detecting means for detecting a temperature of the battery, and wherein the first battery capacity detecting means corrects the first battery capacity based on the temperature detected by the battery temperature detecting means.

5. A charge control apparatus for a vehicle according to claim 3, further comprising time period detecting means for detecting a time period after the start of discharge of the battery until the terminal voltage is detected by the battery voltage detecting means, wherein the battery voltage detecting means corrects the terminal voltage based on the time period detected by the time period detecting means.

6. A charge control apparatus for a vehicle as claimed in claim 2, wherein the target value setting means subtracts a correction value from the second predetermined value to obtain a resultant value and adds the resultant value to the initial capacity so as to obtain the target value when the target value setting means judges that the second battery capacity is higher than the first battery capacity by comparing the first battery capacity with the second battery capacity.

7. A charge control apparatus for a vehicle as claimed in claim 6, wherein said correction value is set directly proportional to a difference between said first battery capacity and said second battery capacity.

8. A charge control apparatus for a vehicle, according to claim 7, further comprising battery temperature detecting means for detecting a temperature of the battery, and wherein the first battery capacity detecting means corrects the first battery capacity based on the temperature detected by the battery temperature detecting means.

9. A charge control apparatus for a vehicle according to claim 7, further comprising time period detecting means for detecting a time period after the start of discharge of the battery until the terminal voltage is detected by the battery voltage detecting means, wherein the battery voltage detecting means corrects the terminal voltage based on the time period detected by the time period detecting means.

10. A charge control apparatus for a vehicle, according to claim 6, further comprising battery temperature detecting means for detecting a temperature of the battery, and wherein the first battery capacity detecting means corrects the first battery capacity based on the temperature detected by the battery temperature detecting means.

11. A charge control apparatus for a vehicle according to claim 6, further comprising time period detecting means for detecting a time period after the start of discharge of the battery until the terminal voltage is detected by the battery voltage detecting means, wherein the battery voltage detecting means corrects the terminal voltage based on the time period detected by the time period detecting means.

12. A charge control apparatus for a vehicle, according to claim 2, further comprising battery temperature detecting means for detecting a temperature of the battery, and wherein the first battery capacity detecting means corrects the first battery capacity based on the temperature detected by the battery temperature detecting means.

13. A charge control apparatus for a vehicle according to claim 2, further comprising time period detecting means for detecting a time period after the start of discharge of the battery until the terminal voltage is detected by the battery voltage detecting means, wherein the battery voltage detecting means corrects the terminal voltage based on the time period detected by the time period detecting means.

14. A charge control apparatus for a vehicle as claimed in claim 1, wherein said target value setting means, when said second battery capacity is greater than the first battery capacity, sets a difference between said first and second battery capacities as an invalid charge capacity.

15. A charge control apparatus for a vehicle, according to claim 14, further comprising battery temperature detecting means for detecting a temperature of the battery, and wherein the first battery capacity detecting means corrects the first battery capacity based on the temperature detected by the battery temperature detecting means.

16. A charge control apparatus for a vehicle according to claim 14, further comprising time period detecting means for detecting a time period after the start of discharge of the battery until the terminal voltage is detected by the battery voltage detecting means, wherein the battery voltage detecting means corrects the terminal voltage based on the time period detected by the time period detecting means.

17. A charge control apparatus for a vehicle as claimed in claim 1, wherein said target value setting means changes said target value to a higher target value while the vehicle is driven under a deceleration condition, or a down slope condition.

18. A charge control apparatus for a vehicle, according to claim 17, further comprising battery temperature detecting means for detecting a temperature of the battery, and wherein the first battery capacity detecting means corrects the first battery capacity based on the temperature detected by the battery temperature detecting means.

19. A charge control apparatus for a vehicle according to claim 17, further comprising time period detecting means for detecting a time period after the start of discharge of the battery until the terminal voltage is detected by the battery voltage detecting means, wherein the battery voltage detecting means corrects the terminal voltage based on the time period detected by the time period detecting means.

20. A charge control apparatus for a vehicle comprising:
a starter driven by a battery mounted on a vehicle, for starting an engine;
an alternator for the vehicle, driven by said engine, for charging said battery;
battery voltage detecting means for detecting a terminal voltage of the battery;
battery current accumulating means for accumulating the charge/discharge currents of said battery which have been detected by said battery current detecting means;
first battery capacity detecting means for detecting a first battery capacity based on the terminal voltage of the battery when the charge current of said battery detected by said battery current detecting means reaches a predetermined value during commencement of said starter;
second battery capacity detecting means for detecting a second battery capacity by adding the charge/discharge currents accumulated by said battery current accumulating means after the detection of the first battery capacity to an initial capacity;
initial capacity setting means for comparing the first battery capacity with a previously detected second battery capacity, for setting as the initial capacity of the battery the smaller of the first battery capacity and the previously detected second battery capacity, and for setting the first battery capacity as the initial battery capacity when the previously detected second battery capacity fails to exist;
target value setting means for detecting as an invalid charge capacity a difference between the first and second battery capacities when the second battery capacity is higher than the first battery capacity, and for setting a target value of the battery after the engine has started based on the invalid charge capacity; and
alternator controlling means for controlling power generated by the alternator for the vehicle in such a manner that said battery is charged at the target value set by said target value setting means.

21. A charge control apparatus for a vehicle as claimed in claim 10, wherein said target value setting means subtracts said invalid charge capacity from a maximum one of previous second battery capacities just before said first battery capacity is detected, so as to obtain an initial target value.

22. A charge control apparatus for a vehicle, according to claim 21, further comprising battery temperature detecting means for detecting a temperature of the battery, and wherein the first battery capacity detecting means corrects the first battery capacity based on the temperature detected by the battery temperature detecting means.

23. A charge control apparatus for a vehicle according to claim 21, further comprising time period detecting means for detecting a time period after the start of discharge of the battery until the terminal voltage is detected by the battery voltage detecting means, wherein the battery voltage detecting means corrects the terminal voltage based on the time period detected by the time period detecting means.

24. A charge control apparatus for a vehicle as claimed in claim 10, wherein said target value setting means, when said invalid charge capacity is zero, sets a previously set target value as the target value.

25. A charge control apparatus for a vehicle, according to claim 24, further comprising battery temperature detecting means for detecting a temperature of the battery, and wherein the first battery capacity detecting means corrects the first battery capacity based on the temperature detected by the battery temperature detecting means.

26. A charge control apparatus for a vehicle according to claim 24, further comprising time period detecting means for detecting a time period after the start of discharge of the battery until the terminal voltage is detected by the battery voltage detecting means, wherein the battery voltage detecting means corrects the terminal voltage based on the time period detected by the time period detecting means.

27. A charge control apparatus for a vehicle as claimed in claim 10, wherein said target value setting means, when said invalid charge capacity is zero and a maximum one of previous second battery capacities is greater than a previously set target value, adds a second predetermined value to said previously set target value to obtain the target value.

28. A charge control apparatus for a vehicle, according to claim 27, further comprising battery temperature detecting means for detecting a temperature of the battery, and wherein the first battery capacity detecting means corrects the first battery capacity based on the temperature detected by the battery temperature detecting means.

29. A charge control apparatus for a vehicle according to claim 27, further comprising time period detecting means for detecting a time period after the start of discharge of the battery until the terminal voltage is detected by the battery voltage detecting means, wherein the battery voltage detecting means corrects the terminal voltage based on the time period detected by the time period detecting means.

30. A charge control apparatus for a vehicle as claimed in claim 20, wherein said target value setting means changes said target value to a higher target value while the vehicle is driven under a deceleration condition, or a down slope condition.

31. A charge control apparatus for a vehicle, according to claim 30, further comprising battery temperature detecting means for detecting a temperature of the battery, and wherein the first battery capacity detecting means corrects the first battery capacity based on the temperature detected by the battery temperature detecting means.

32. A charge control apparatus for a vehicle according to claim 30, further comprising time period detecting means for detecting a time period after the start of discharge of the battery until the terminal voltage is detected by the battery voltage detecting means, wherein the battery voltage detecting means corrects the terminal voltage based on the time period detected by the time period detecting means.

33. A charge control apparatus for an automobile comprising:
an alternator for charging a battery;
battery current detecting means for detecting charge/discharge currents of said battery;
battery voltage detecting means for detecting a terminal voltage of the battery;
battery current accumulating means for accumulating the charge/discharge currents of said battery;
first battery capacity detecting means for detecting a first battery capacity based on the terminal voltage of the battery when the discharge current reaches a predetermined value;
second battery capacity detecting means for detecting a second battery capacity based on the accumulated charge/discharge currents;
initial capacity setting means for setting an initial capacity based on the first and the second battery capacity;
target value setting means for setting a target value of the battery in response to the initial capacity; and
generation controlling means for controlling power generated by the alternator for the vehicle in such a manner that said battery is charged at the target value.

34. A charge control apparatus for a vehicle as claimed in claim 33, wherein the initial capacity setting means includes comparing means for comparing the first battery capacity to the second battery capacity to determine which of the first and the second battery capacity is smaller, and setting means for setting the smaller of the first and second battery capacity as the initial capacity.

35. A charge control apparatus for a vehicle as claimed in claim 34, wherein the setting means sets the first battery capacity as the initial capacity when the second battery capacity fails to exist.

36. A charge control apparatus for a vehicle as claimed in claim 33, wherein said target value setting means adds a second predetermined value to the initial capacity to obtain the target value.

37. A charge control apparatus for a vehicle as claimed in claim 36, wherein the target value setting means determines the second predetermined value based on a condition of the battery as indicated by the initial capacity.

38. A charge control apparatus for a vehicle as claimed in claim 36, wherein the target value setting means subtracts a correction value from the second predetermined value to obtain a resultant value and adds the resultant value to the initial capacity so as to obtain the target value when the target value setting means judges that the second battery capacity is higher than the first battery capacity by comparing said first battery capacity with said second battery capacity.

39. A charge control apparatus for a vehicle as claimed in claim 38, wherein said correction value is set directly proportional to a difference between said first battery capacity and said second battery capacity.

* * * * *